(12) United States Patent
Mehrabi

(10) Patent No.: US 9,103,866 B2
(45) Date of Patent: Aug. 11, 2015

(54) DEVICE PLUG DETECTION APPARATUS AND METHOD

(71) Applicant: QUALCOMM Incorporated, San Diego, CA (US)

(72) Inventor: Arash Mehrabi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 352 days.

(21) Appl. No.: 13/675,995

(22) Filed: Nov. 13, 2012

(65) Prior Publication Data

US 2013/0320993 A1   Dec. 5, 2013

Related U.S. Application Data

(60) Provisional application No. 61/654,350, filed on Jun. 1, 2012.

(51) Int. Cl.
| | |
|---|---|
| *G01R 31/00* | (2006.01) |
| *H01R 13/66* | (2006.01) |
| *G01R 31/04* | (2006.01) |
| *H01R 13/70* | (2006.01) |
| *H01R 13/703* | (2006.01) |
| *H01R 24/58* | (2011.01) |
| *H04R 5/04* | (2006.01) |

(Continued)

(52) U.S. Cl.
CPC .............. *G01R 31/04* (2013.01); *H01R 13/70* (2013.01); *H01R 13/7031* (2013.01); *H01R 24/58* (2013.01); *H04M 1/72527* (2013.01); *H04R 5/04* (2013.01); *H01R 2107/00* (2013.01); *H01R 2201/16* (2013.01); *H04M 1/6058* (2013.01); *H04R 2420/05* (2013.01)

(58) Field of Classification Search
CPC ...... G01R 31/04; G01R 31/041; H01R 23/02; H01R 23/10; H01R 23/7073; H01R 13/70; H01R 13/7031; H01R 24/58; H01R 2107/00; H01R 2201/16; H04R 5/04; H04R 2420/05; H04M 1/6058; H04M 1/72527
USPC ........ 324/508, 500; 439/620.15, 620.21, 660, 439/668, 669, 170, 893
See application file for complete search history.

(56) References Cited

U.S. PATENT DOCUMENTS

| | | | |
|---|---|---|---|
| 7,618,294 B1 * | 11/2009 | Lin et al. ........................ | 439/669 |
| 7,836,216 B2 | 11/2010 | Kashi et al. | |

(Continued)

FOREIGN PATENT DOCUMENTS

EP   2317774 A2   5/2011

OTHER PUBLICATIONS

International Search Report and Written Opinion—PCT/US2013/043724—ISA/EPO—Aug. 6, 2013.

*Primary Examiner* — Hoai-An D Nguyen
(74) *Attorney, Agent, or Firm* — Linda G. Gunderson

(57) ABSTRACT

A particular apparatus includes a receptacle having a first pin configured to contact a tip region of the device plug at a first location when the device plug is inserted into the receptacle. The first location may be located between a midpoint of the tip region and a tip of the device plug. The receptacle further includes a second pin configured to contact a second region of the device plug at a second location. The receptacle further includes a third pin configured to contact a third region of the device plug at a third location. The receptacle further includes a fourth pin configured to contact a fourth region of the device.

36 Claims, 10 Drawing Sheets

(51) Int. Cl.
*H04M 1/725* (2006.01)
*H01R 107/00* (2006.01)
*H04M 1/60* (2006.01)

(56) References Cited

U.S. PATENT DOCUMENTS

| | | |
|---|---|---|
| 7,912,501 B2 | 3/2011 | Johnson et al. |
| 8,150,046 B2 | 4/2012 | Hansson et al. |
| 2005/0090141 A1 | 4/2005 | Peng et al. |
| 2005/0266710 A1* | 12/2005 | Liu .............................. 439/170 |
| 2007/0134991 A1 | 6/2007 | Kohli et al. |
| 2008/0305676 A1 | 12/2008 | Fiennes |
| 2009/0296952 A1 | 12/2009 | Pantfoerder et al. |
| 2010/0311281 A1* | 12/2010 | Prest et al. .................... 439/676 |
| 2011/0237131 A1 | 9/2011 | Fields et al. |
| 2011/0268289 A1 | 11/2011 | Baranwal et al. |
| 2013/0108063 A1* | 5/2013 | Verhoeve et al. ............... 381/58 |

\* cited by examiner

DEVICE PLUG DETECTION APPARATUS AND METHOD

CLAIM OF PRIORITY

The present application claims priority from U.S. Provisional Patent Application No. 61/654,350 filed on Jun. 1, 2012, the contents of which are expressly incorporated herein by reference in their entirety.

FIELD

The present disclosure is generally related to electronic device connectors.

DESCRIPTION OF RELATED ART

Advances in technology have resulted in smaller and more powerful computing devices. For example, there currently exist a variety of portable personal computing devices, including wireless communication devices, such as wireless telephones and personal digital assistants (PDAs). These wireless communication devices are typically small, lightweight, and easily carried by users. These wireless communication devices (e.g., cellular telephones and internet protocol (IP) telephones) may also communicate voice and data packets over wireless networks and may incorporate other types of devices (e.g., a digital still camera, a digital video camera, a digital recorder, and an audio file player).

Wireless communication devices may include one or more interfaces that enable a wireless communication device to connect to peripheral devices. For example, a wireless communication device (e.g., a cellular telephone) may include a receptacle configured to interface the wireless communication device with a peripheral device when a device plug is inserted into the receptacle. Additionally, the device plug may be coupled to numerous types of peripheral devices, each having different capabilities. Typically, the receptacle of the wireless communication device includes a mechanical detection mechanism to detect initial insertion of the device plug into the receptacle. Because numerous peripheral devices having different capabilities may be coupled to the device plug, the wireless communication device may initiate a determination of the capabilities of the peripheral device after initial detection of the device plug.

For example, the device plug may be coupled to a headset that includes speakers and a microphone, or the device plug may be coupled to headphones that do not include a microphone. When the device plug is coupled to the headset, a first set of capabilities may be provided to the wireless communication device and when the device plug is coupled to the headphones, a second set of capabilities may be provided to the wireless communication device. For example, the wireless communication device may send audio to the speakers of the headset and may receive audio from the microphone of the headset, but may only send audio to the headphones. In order to determine the capabilities of the peripheral device that is coupled to the device plug, the wireless communication device may use a complex and energy consuming detection algorithm that may be triggered by the mechanical detection mechanism. However, the detection algorithm may sometimes inaccurately determine or be unable to determine the capabilities of the peripheral device when the mechanical detection mechanism detects insertion of the device plug into the receptacle prior to the device plug being fully inserted.

For example, the receptacle may include multiple pins configured to contact a specific region of the device plug when the device plug is fully inserted into the receptacle. As the device plug is inserted into the receptacle, one or more of the pins may be in an incorrect alignment with respect to the device plug while the detection algorithm is attempting to detect the capability of a peripheral device (e.g., whether the peripheral device is a headset that includes a microphone or a pair of headphones that does not include a microphone) that is coupled to the device plug. For example, one of the pins may be in contact with an insulating layer of the device plug or a region of the device plug other than the specific region that the pin was configured to contact. The incorrect alignment of the one or more pins may cause the detection algorithm to improperly detect or be unable to determine the capability of the peripheral device. To illustrate, the detection algorithm may detect that the peripheral device is the pair of headphones even though the peripheral device is actually the headset. Thus, the device may not activate a capability of the device to receive audio from the microphone of the headset.

SUMMARY

An apparatus including a receptacle to receive a device plug is disclosed. At least one of the embodiments described herein may result in a reduced likelihood that the receptacle will inaccurately detect a capability of a peripheral device that is coupled to a device plug inserted into the receptacle. By reducing the likelihood that the receptacle will inaccurately detect the capability of the peripheral device, the complexity of logic associated with the receptacle for use in detecting the capability of the peripheral device may be reduced.

A representative device plug suitable for use with the described receptacle may be a tip-ring-ring-sleeve (TRRS) device plug that is coupled to an electronic device (e.g., a headset that includes a microphone and one or more speakers). The device plug may include multiple regions, such as a tip region, a second region, a third region, and a fourth region. The tip region and the second region may be separated by a first insulating layer, the second region and the third region may be separated by a second insulating layer, and the third region and the fourth region may be separated by a third insulating layer. The receptacle may include four pins each configured to contact a corresponding region of the four regions of the device plug.

A first pin of the receptacle may contact a tip region of a received device plug at a first location when the device plug is fully inserted into the receptacle. The first location may be located at approximately a midpoint of the tip region of the device plug and a tip of the device plug. A second pin of the receptacle may be configured to contact a second region of the received device plug at a second location. A third pin of the receptacle may be configured to contact a third region of the device plug at a third location. The third location may be between a midpoint of the third region and an edge portion of the third region that is adjacent to a fourth region of the received device plug. A fourth pin of the receptacle may be configured to contact the fourth region of the received device plug.

In a particular embodiment, a method includes determining whether a device plug is inserted into a receptacle based on a switching signal. The receptacle includes a first pin, a second pin, a third pin, a fourth pin, and a switch. The switch may be configured to generate the switching signal when the switch transitions from a first state to a second state. The switch may be in the first state when the device plug is not inserted into the receptacle and may transition from the first state to the second state when the device plug is inserted or partially inserted into the receptacle. The first pin may be configured to contact a tip region of the device plug at a first location when the device plug is fully inserted into the receptacle. The second pin may be configured to contact a second region of the device plug at a second location when the device plug is fully inserted into the receptacle. The second location may be located between a midpoint of the second region and an edge portion of the second region adjacent to a third region of the device plug. The third pin may be configured to contact the third region of the device plug at a third location when the device plug is fully inserted into the receptacle. The third location may be located between a midpoint of the third region and an edge portion of the third region adjacent to a fourth region of the device plug. The fourth pin may be configured to contact the fourth region of the device plug at a fourth location when the device plug is fully inserted into the receptacle. The method further includes determining whether a microphone is electronically coupled via the fourth region to the fourth pin when the switching signal indicates that the switch has transitioned from the first state to the second state.

In another embodiment, an apparatus includes a first pin configured to contact a tip region of a device plug when the device plug is fully inserted into a receptacle of the apparatus. The apparatus further includes a second pin configured to contact a second region of the device plug at a second location. The second location may be between a midpoint of the second region and an edge portion of the second region adjacent to a third region of the device plug. The apparatus further includes a third pin configured to contact the third region of the device plug at a third location. The third location may be located between a midpoint of the third region and an edge portion of the third region adjacent to a fourth region of the device plug. The apparatus further includes a fourth pin configured to contact the fourth region of the device. The apparatus further includes detection logic responsive to a switch to determine whether a receiver is electronically coupled via the fourth region to the fourth pin.

In another embodiment, a computer-readable storage medium includes instructions that, when executed by a processor, cause the processor to determine whether a device plug is inserted into a receptacle based on a switching signal. The receptacle includes a switch configured to generate the switching signal when the switch transitions from a first state to a second state. The first state may indicate that the device plug is not inserted into the receptacle and the second state may indicate that the device plug is inserted into the receptacle. The receptacle further includes a first pin configured to contact a tip region of a device plug at a first location when the device plug is inserted into the receptacle, a second pin configured to contact a second region of the device plug at a second location when the device plug is inserted into the receptacle, a third pin configured to contact the third region of the device plug at a third location when the device plug is inserted into the receptacle, and a fourth pin configured to contact the fourth region of the device plug at a fourth location when the device plug is inserted into the receptacle. The second location may be located between a midpoint of the second region and an edge portion of the second region adjacent to the third region of the device plug. The third location may be located between a midpoint of the third region and an edge portion of the third region adjacent to the fourth region of the device plug. The computer-readable medium includes instructions that, when executed by the processor, cause the processor to determine whether a microphone is electronically coupled via the fourth region to the fourth pin when the switching signal indicates that the switch is in the second state.

In yet another embodiment, an apparatus includes first means for contacting a tip region of a device plug when the device plug is inserted into the receptacle, second means for contacting a second region of the device plug at a second location, third means for contacting a third region of the device plug at a third location, and fourth means for contacting a fourth region of the device plug at a fourth location. The apparatus may include means for determining whether a microphone is electrically coupled to the fourth means. The second location may be between a midpoint of the second region and an edge portion of the second region adjacent to the third region of the device plug. The third location may be between a midpoint of the third region and an edge portion of the third region adjacent to the fourth region of the device plug.

A particular advantage provided by at least one of the disclosed embodiments may be a reduced probability of detecting insertion of a device plug prior to each pin of the receptacle contacting a corresponding intended region of the device plug. Another advantage provided by at least one of the disclosed embodiments may be reduced complexity of a detection algorithm. Further, one or more of the disclosed embodiments may result in a reduced likelihood that the detection algorithm inaccurately detects a capability of a peripheral device coupled to the device plug. Other aspects, advantages, and features of the present disclosure will become apparent after review of the entire application, including the following sections: Brief Description of the Drawings, Detailed Description, and the Claims.

DETAILED DESCRIPTION

Figure 1A:
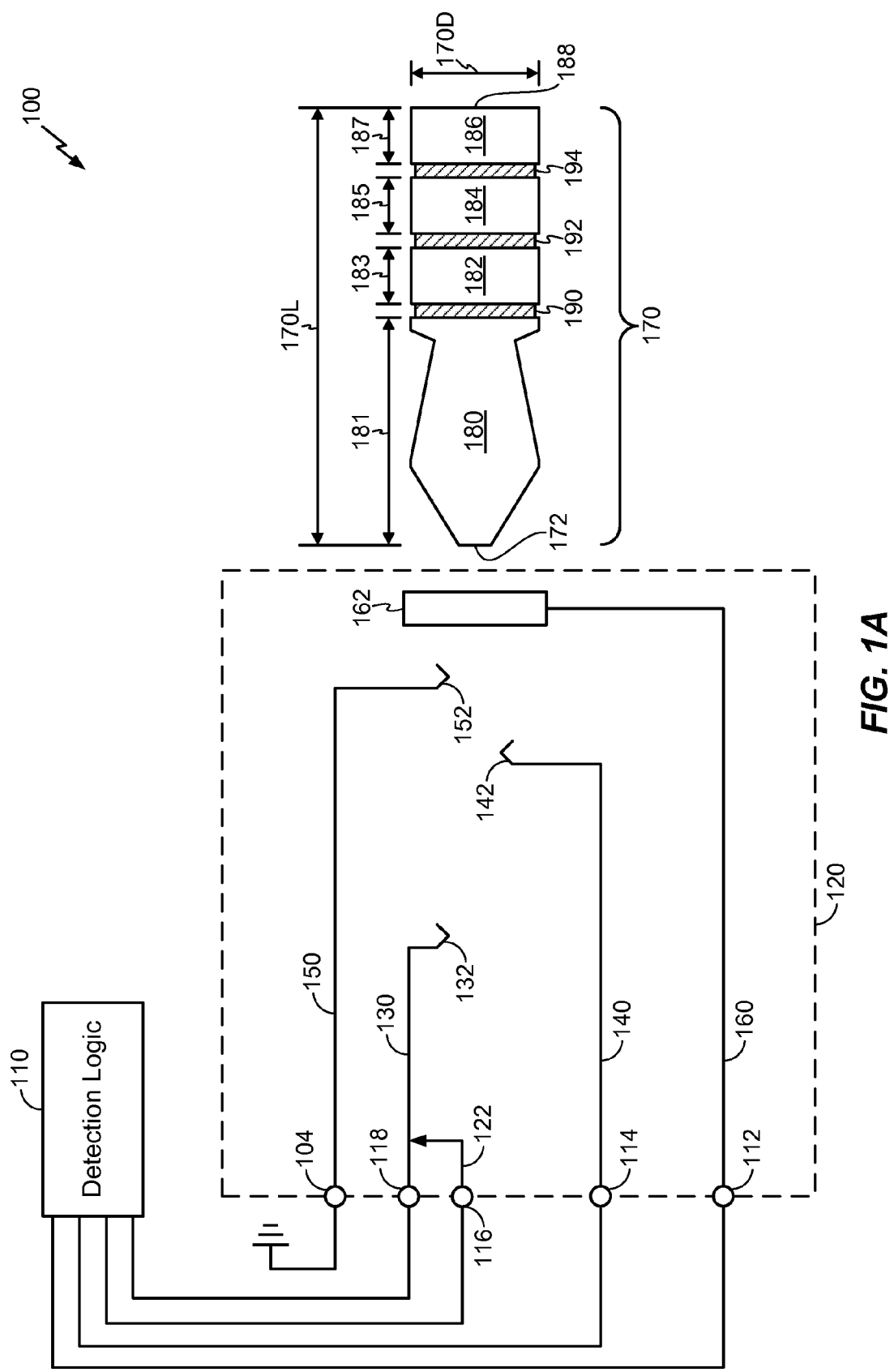
FIGS. 1A-1D illustrate a side view of a first particular illustrative embodiment of a receptacle to receive a device plug.

Particular embodiments of the present disclosure are described further with reference to the drawings (which are not to scale, although relative positions of certain features illustrated in the drawings may be indicated). In the description, common features are designated by common reference numbers throughout the drawings.

Referring to FIGS. 1A-1D, a side view of a first particular illustrative embodiment of a device 100 including a receptacle to receive a device plug is shown. As shown in FIG. 1, the device 100 may include detection logic 110 and a receptacle 120. The receptacle 120 may be configured to receive a device plug 170.

The detection logic 110 may be configured to initiate detection of the device plug 170 in response to insertion of the device plug 170 into the receptacle 120. The detection logic 110 may be coupled to the receptacle 120 via a first node 118, a second node 114, a third node 104, a fourth node 112, and a fifth node 116. In a particular embodiment, the detection logic 110 may include a general purpose input/output pin (GPIO) (not shown) that is coupled to the fifth node 116.

The receptacle 120 may include a switch 122, a first pin 130, a second pin 140, a third pin 150, and a fourth pin 160. The switch 122 may be electrically coupled to the detection logic 110 via the fifth node 116. The switch 122 may be configured to be in a first state prior to insertion of the device plug 170 and to transition from the first state to a second state when the device plug 170 has been inserted into the receptacle 120 to at least an initial detection position as described below with reference to FIGS. 1C, 2A, 3A, and 4A. As illustrated in FIG. 1A, the switch 122 may be a normally-closed (NC) switch where, in the first state (e.g., a closed state), the switch 122 may be electrically coupled to, or electrically connected to, the first pin 130 when the device plug 170 is not inserted into the receptacle 120. The switch 122 may transition from the first state (e.g., the closed state) to the second state (e.g., an open state) when the device plug 170 is inserted into the receptacle 120 to at least the initial detection position, as described with reference to FIG. 1C.

As illustrated in FIG. 1A, the first pin 130 may be electrically coupled to the detection logic 110 via the first node 118. The first pin 130 may include a first contact 132 that contacts, or connects to, a tip region 180 of the device plug 170. The second pin 140 may be electrically coupled to the detection logic 110 via the second node 114. The second pin 140 may include a second contact 142 that contacts, or connects to, a second region 182 of the device plug 170. The third pin 150 may be electrically coupled to a ground terminal via the third node 104. The third pin 150 may include a third contact 152 that contacts, or connects to, a third region 184 of the device plug 170. The fourth pin 160 may be electrically coupled to the detection logic 110 via the fourth node 112. The fourth pin 160 may include a fourth contact 162 that contacts, or connects to, a fourth region 186 of the device plug 170.

In an illustrative embodiment, the receptacle 120 is a tip, ring, ring, sleeve (TRRS) plug receptacle and is configured to receive a TRRS device plug (e.g., the device plug 170). In alternate embodiments, the receptacle 120 may be configured to receive additional device plugs, such as a tip, ring, sleeve (TRS) device plug having three contacts and a tip, sleeve (TS) device plug having two contacts. In alternate embodiments, the receptacle 120 may have two, three, or more than four pins.

The device plug 170 may be inserted into the receptacle 120 beginning with the tip 172. The device plug 170 may have a length 170L and a diameter 170D. In an illustrative embodiment, the length 170L may be approximately 14.0 millimeters. In an illustrative embodiment, the diameter 170D may be approximately 3.5 millimeters. In other embodiments, the diameter 170D may be approximately 2.5 millimeters or may be approximately 6.35 millimeters. In an illustrative embodiment, the device plug 170 may include the tip region 180, the second region 182, the third region 184, and the fourth region 186. The tip region 180 of the device plug 170 may have a length 181 that extends from the tip 172 to an edge of the tip region 180 that is proximate to the second region 182. In an embodiment, the tip region length 181 may be approximately 5.0 millimeters. The tip region 180 may be electrically isolated from the second region 182 by a first insulating layer 190. The second region 182 of the device plug 170 may have a length 183 that extends from an edge of the second region 182 that is proximate to the tip region 180 to an edge of the second region 182 that is proximate to the third region 184. In an illustrative embodiment, the second region length 183 may be approximately 2.5 millimeters. The second region 182 may be electrically isolated from the third region 184 by a second insulating layer 192. The third region 184 of the device plug 170 may have a length 185 that extends from an edge of the third region 184 that is proximate to the second region 182 to an edge of the third region 184 that is proximate to the fourth region 186. In an illustrative embodiment, the third region length 185 may be approximately 2.5 millimeters. The third region 184 may be electrically isolated from the fourth region 186 by a third insulating layer 194. The fourth region 186 of the device plug 170 may have a length 187 that extends from an edge of the fourth region 186 that is proximate to the third region 184 to an end 188 of the device plug 170 that is opposite of the tip 172 of the device plug 170. In an illustrative embodiment, the fourth region length 187 may be approximately 2.5 millimeters. In an illustrative embodiment, the first insulating layer 190, the second insulating layer 192, and the third insulating layer 194 may each be approximately 0.5 millimeters thick.

As shown in FIG. 1A, each of the pins 130, 140, 150, and 160 may be in a first position (i.e., an initial position) when the device plug 170 has not been inserted into the receptacle 120. In an embodiment, when the pins 130, 140, 150, and 160 are in the initial position, each of the pins may be linearly aligned within a single plane. In a particular embodiment, the pins 130, 140, 150, and 160 are linearly aligned within a single plane along a longitudinal axis of the device plug 170 when the device plug 170 is inserted into the receptacle 120. Additionally, each of the pins 130, 140, 150, and 160 may be configured to contact, or connect to, a particular region of the device plug 170 at various locations as the device plug 170 is inserted into the receptacle 120 as described with reference to FIGS. 1B-5B.

Figure 1B:
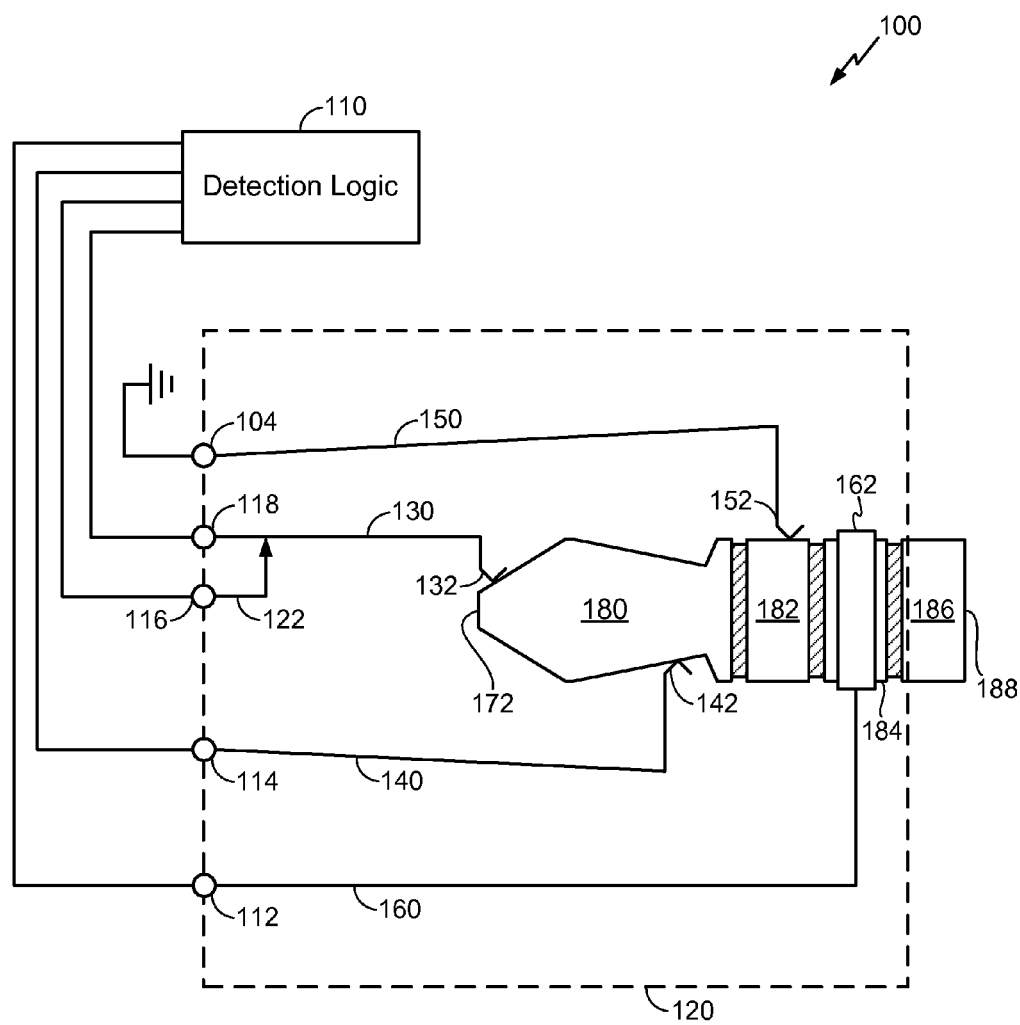

Referring to FIG. 1B, a second side view of the first particular illustrative embodiment of the device 100 is shown. In FIG. 1B, the receptacle 120 and the device plug 170 of FIG. 1A are shown. As illustrated in FIG. 1B, the device plug 170 has been inserted into the receptacle 120 to a pre-initial detection position. To illustrate, the device plug 170 is in the pre-initial detection position because the switch 122 remains electrically coupled to the first pin 130. As illustrated in FIG. 2, the second contact 142 is contacting, or connecting to, the tip region 180 of the device plug 170 and the third contact 152 is contacting, or connecting to, the second region 182 of the device plug 170. When the contacts 142 and 152 contact, or connect to, the device plug 170, the contacts are displaced from their respective initial positions (i.e., the initial positions illustrated in FIG. 1). Thus, as the device plug 170 is inserted into the receptacle 120, the contacts 132, 142, and 152 come into contact, or connect to, an exterior surface of the device plug 170 and are displaced.

In a particular embodiment, the detection logic 110 may detect the state of the switch 122 by measuring the voltage of the fifth node 116 relative to a ground (e.g., a voltage of the third node 104) or the impedance of the switch 122 via fifth node 116. In a particular embodiment, the voltage or the impedance of the fifth node 116 may be detected at the detection logic 110 via a GPIO node (not shown). In an alternative embodiment, the detection logic 110 may not include the GPIO node and the voltage or the impedance of the fifth node 116 may be received or otherwise detected by the detection logic 110 using other circuitry or detection methods. In a particular embodiment, the detection logic 110 may include circuitry that is configured to measure the impedance of the switch 122 via fifth node 116. The detection logic 110 may further include circuitry configured to determine whether the measured impedance of the fifth node 116 is associated with the first state (e.g., the closed state) of the switch 122 or the second state (e.g., the open state) of the switch 122. In a particular embodiment, the measured impedance may have a first value when the switch 122 is in the first state (e.g., the closed state) and may have a second value when the switch 122 is in the second state. In an embodiment, the first impedance value may be less than the second impedance value. In another embodiment, the first impedance value may be greater than the second impedance value.

In a particular embodiment, the fifth node 116 may be pulled up via a first resistor (e.g., a 1 Mohm resistor) and may be pulled down via a second resistor (e.g., a 10 kohm resistor). For example, the fifth node 116 may be pulled down by the second resistor when the switch 122 is in the first state (e.g., the closed state). When the fifth node 116 is pulled down by the second resistor, the measured impedance may be approximately zero (0). The fifth node 116 may be pulled up by the first resistor when the switch 122 is in the second state (e.g., the open state). When the fifth node 116 is pulled up by the first resistor, the measured impedance may be a non-zero value (e.g., high). In a particular embodiment, the non-zero value may correspond to a $V_{dd}$ associated with the receptacle 120.

During operation, the detection logic 110 may detect a state of the switch 122 based on the measured impedance of the fifth node 116. Based on the detected state of the switch 122, the detection logic 110 may determine whether to initiate detection of the capabilities of an electronic device (e.g., a headset) that is coupled to the device plug 170. For example, when the device plug 170 has been inserted to the pre-initial detection position as illustrated in FIG. 2, the detection logic 110 may determine that the measured impedance of the fifth node 116 corresponds to the first impedance value and detect that the switch 122 is in the first state (e.g., the closed state). When the detection logic 110 detects that the switch 122 is in the first state, the detection logic 110 may refrain from initiating detection of the capabilities of the electronic device that is coupled to the device plug 170.

Figure 1C:
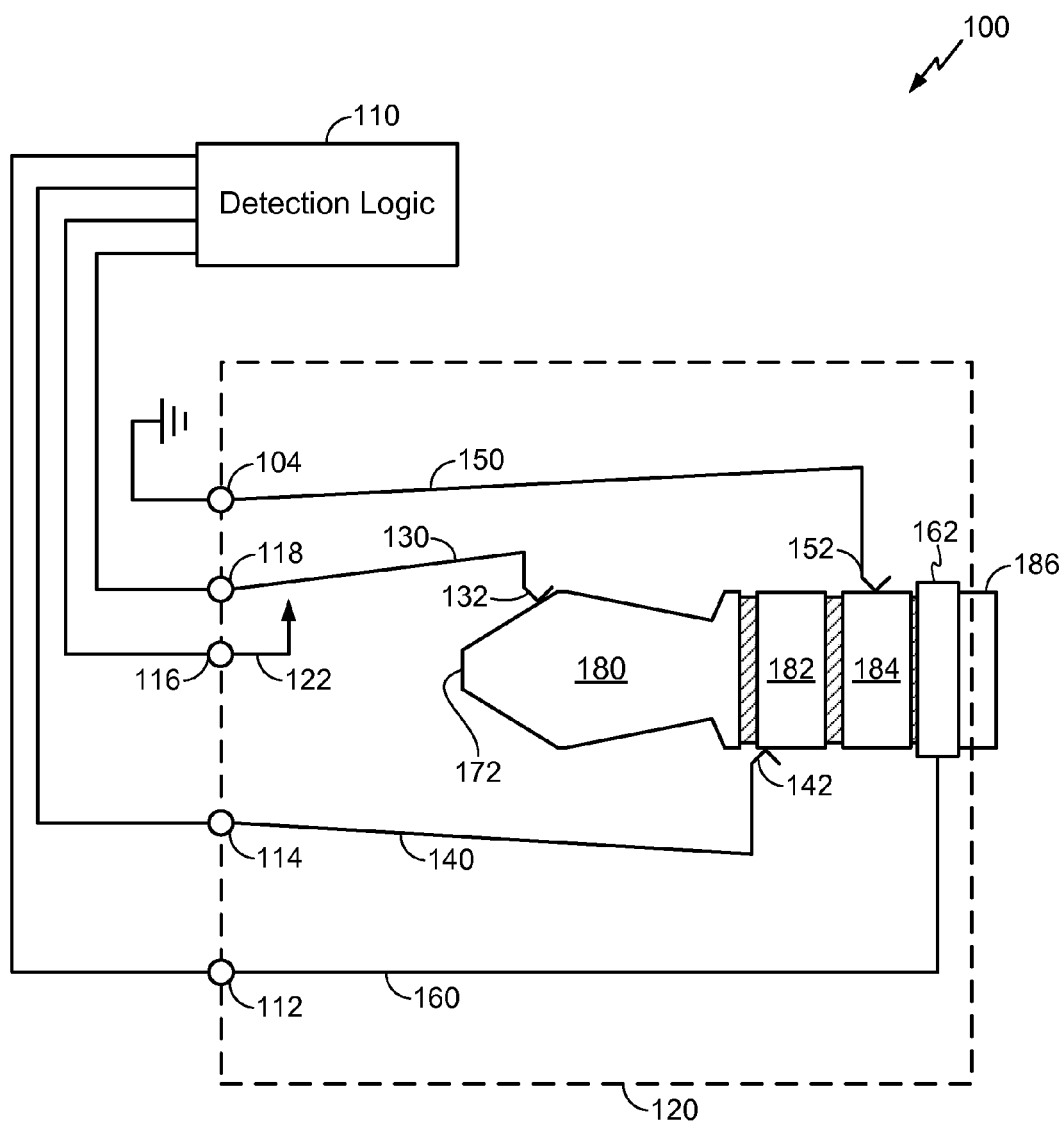

Referring to FIG. 1C, a third side view of the first particular illustrative embodiment of the device 100 is shown. In FIG. 1C, the receptacle 120 and the device plug 170 of FIGS. 1A and 1B are shown. As illustrated in FIG. 1C, the device plug 170 has been inserted into the receptacle 120 to an initial detection position. To illustrate, the device plug 170 has been inserted into the receptacle 120 such that the first contact 132 of first pin 130 is contacting, or connecting to, the tip region 180 of the device plug 170, causing the first pin 130 to be displaced from its initial position (i.e., the position of the first pin 130 in FIGS. 1A and 1B). Further, the second contact 142 of the second pin 140 may be in electrical contact with, or electrically connected to, the second region 182 of the device plug 170, the third contact 152 of the third pin 150 may contact, or electrically connect to, the third region 184 of the device plug 170, and the fourth contact 162 of the fourth pin 160 may contact, or electrically connect to, the fourth region 186 of the device plug 170 without contacting, or connecting to, the third region 184 of the device plug 170.

As shown in FIG. 1C, when the first pin 130 is displaced, the switch 122 may lose electrical contact with the first pin 130. When the switch 122 loses electrical contact with the first pin 130, the switch 122 transitions from the first state (i.e., the closed state) to the second state (i.e., the open state). The detection logic 110 may detect that the switch 122 has transitioned to the second state (e.g., the open state). For example, the detection logic 110 may measure the impedance of the switch 122 via the fifth node 116. The detection logic 110 may determine that the measured impedance of the switch 122 corresponds to the second impedance value and detect that the switch 122 has transitioned from the first state to the second state (e.g., the open state). When the detection logic 110 detects that the switch 122 has transitioned from the first state to the second state, the detection logic 110 may initiate detection of a capability of the electronic device (e.g., the headset) that is coupled to the device plug 170.

The tip region 180 may be coupled to a first speaker of the headset (e.g., a left speaker), the second region 182 may be coupled to a second speaker of the headset (e.g., a right speaker), the third region 184 may be coupled to a ground of the headset, and the fourth region 186 may be coupled to a microphone of the headset. Audio signals may be communicated to the speakers (e.g., the first speaker and the second speaker) via the first contact 132 that is in electrical contact with the tip region 180 of the device plug 170 and via the second contact 142 that is in electrical contact with the second region 182 of the device plug 170. In a particular embodiment, a first audio signal may be sent to the first speaker via the first pin 130 and a second audio signal corresponding to a second audio channel may be sent to the second speaker via the second pin 140. In an embodiment, the first audio signal and the second audio signal may be the same. In another embodiment, the first audio signal may correspond to a first audio channel (e.g., a left audio channel) and the second audio signal may correspond to a second audio channel (e.g., a right audio channel). In yet another embodiment, the first audio signal may correspond to the second audio channel (e.g., the right audio channel) and the second audio signal may correspond to the first audio channel (e.g., the left audio channel). Capability detection may include whether, how many, and what types of input and/or output devices are coupled to the device plug 170. For example, detecting the capability of the electronic device may include determining whether the device plug 170 is coupled to a headset that includes a microphone or a pair of headphones that does not include a microphone. As another example, detecting the capability of the electronic device may include determining whether the device plug 170 is coupled to a headset that includes a volume control (e.g., the volume control may be coupled to the fourth region 186 of the device plug 170).

To illustrate, in response to detecting that the switch 122 has transitioned to the second state, the detection logic 110 may initiate capability detection by applying a bias voltage to the fourth contact 162 via the fourth pin 160. In an embodiment, the bias voltage may be applied to the fourth contact 162 via a resistor (e.g., a 2.2 kohm resistor). In a particular embodiment, the detection logic 110 may measure a voltage level of the fourth pin 160 relative to a ground (or compare the voltage level with a predetermined threshold) and, based on the determined voltage level, may determine whether the device coupled to the device plug 170 is a pair of headphones or a headset that includes a microphone, volume control, or some other device in addition to speaker(s). For example, a first measured voltage may indicate that the device plug 170 is coupled to a pair of headphones (e.g., the fourth region 186 of the device plug 170 is not coupled to a microphone, a volume control, or some other device) and a second measured voltage level may indicate that the device plug 170 is coupled to a headset (e.g., the fourth region 186 of the device plug 170 is coupled to the microphone of the headset). In a particular embodiment, the first measured voltage level may be approximately zero (0) and the second measured voltage level may be non-zero. In another particular embodiment, the detection logic 110 may compare the voltage level of the fourth pin 160 to a threshold voltage level and, based on the comparison, the detection logic 110 may determine whether the device coupled to the device plug 170 is the pair of headphones or the headset. In an illustrative embodiment, the threshold voltage level may be a pre-determined threshold voltage level.

In a particular embodiment, the device plug 170 may be a TRS device plug and the third region 184, the third insulating layer 194, and the fourth region 186 may form a single region. When the device plug 170 is the TRS device plug (e.g. the region formed by combining the third region 184, the third insulating layer 194, and the fourth region 186) may be in electrical contact with, or electrically connected to, both the third contact 152 and the fourth contact 160.

In a particular embodiment, the receptacle 120 may be incorporated into an electronic device, such as the device 100 of FIG. 1A. The device 100 may include an internal microphone. In response to determining that the device plug 170 is coupled to a headset or other device that includes a microphone, the detection logic 110 may disable the internal microphone and may enable the device 100 to receive, via the fourth pin 160, input (e.g., audio signals) captured by the microphone of the headset. In a particular embodiment, the device 100 may include additional logic (i.e., circuitry) to process the input from the microphone of the headset.

Figure 1D:
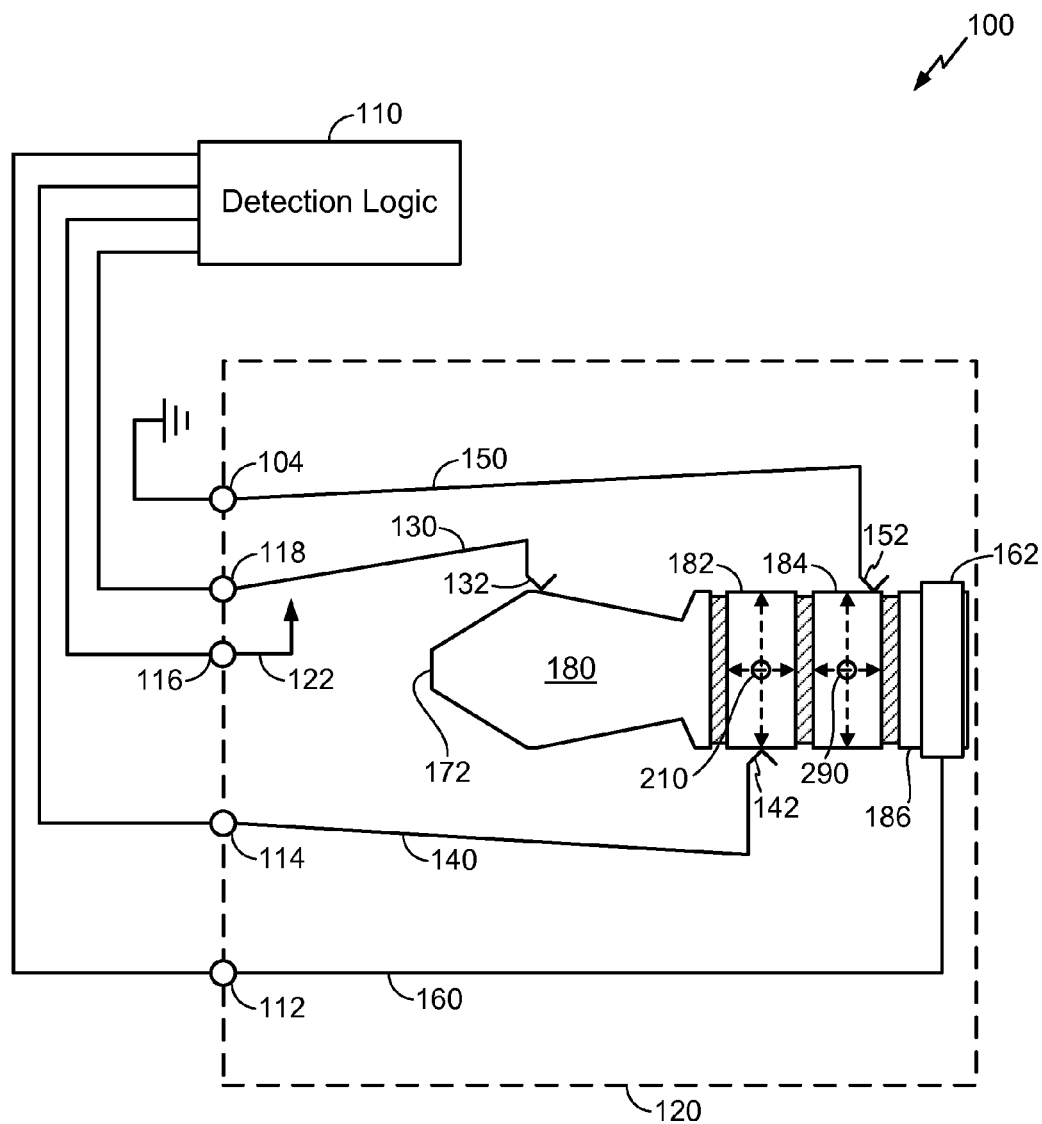

Referring to FIG. 1D, a third side view of the first particular illustrative embodiment of the device 100 is shown. In FIG. 1D, the receptacle 120 and the device plug 170 of FIGS. 1A-1C are shown. In FIG. 1D, the device plug 170 has been fully inserted into the receptacle 120.

As illustrated in FIG. 1D, when the device plug 170 is fully inserted into the receptacle 120, the first pin 130 may be displaced from its initial position (i.e., the position of the first pin 130 in FIGS. 1A and 1B). Additionally, the second pin 140 and the third pin 150 may be displaced from their initial positions (i.e., the positions of the second pin 140 and the third pin 150 in FIG. 1A). In a particular embodiment, the displacement of the pins 130, 140, 150 may vary. For example, the displacement of the pins 140 and 150 in FIG. 1B may be more or may be less than the displacement of the pins 140 and 150 in FIGS. 1C and 1D. The displacement of the first pin 130 in FIG. 1D may be more or may be less than the displacement of the first pin 130 in FIG. 1C. As shown in FIG. 1D, the switch 122 may remain in the second state (e.g., the open state) when the device plug 170 is fully inserted into the receptacle 120.

In a particular embodiment, each of the contacts 132, 142, 152, 162 may be configured (e.g., based on the respective lengths and locations of the pins 130, 140, 150, 160 and contacts 132, 142, 152, 162 within the receptacle 120) to contact, or electrically connect to, the device plug 170 at a particular location when the device plug 170 is fully inserted into the receptacle 120. For example, the first contact 132 of the first pin 130 may be configured to contact, or electrically connect to, a tip region 180 of the device plug 170 at a first location when the device plug 170 is fully inserted into the receptacle 120. In an embodiment, the first location is located along a longitudinal axis of the device plug 170 at a point that is at approximately a midpoint of the tip region 180 of the device plug 170. In another embodiment, the first location is located along the longitudinal axis of the device plug 170 at a point between the midpoint of the tip region 180 of the device plug 170 and the tip 172, as shown in FIG. 1D. The midpoint may be located along the longitudinal axis of the device plug 170 at a point that is located approximately halfway between the tip 172 of the device plug 170 and an edge portion of the tip region 180 that is proximate to the second region 182.

The second contact 142 of the second pin 140 may be configured to contact, or electrically connect to, the second region 182 of the device plug 170 at a second location when the device plug 170 is fully inserted into the receptacle 120. In a particular embodiment, the second location is located along the longitudinal axis of the device plug 170 at a point that is located at approximately a midpoint 210 of the second region 182. The midpoint 210 of the second region 182 may be located along the longitudinal axis of the device plug 170 at a point that is approximately halfway between a first edge portion of the second region 182 that is proximate to the tip region 180 and a second edge portion of the second region 182 that is proximate to the third region 184, as shown in FIG. 1D.

The third contact 152 of the third pin 150 may be configured to contact, or electrically connect to, the third region 184 of the device plug 170 at a third location when the device plug 170 is fully inserted into the receptacle 120. In a particular embodiment, the third location is located along the longitudinal axis of the device plug 170 at a point between a midpoint 290 of the third region 184 and a first edge portion of the third region 184 that is proximate to the fourth region 186. The midpoint 290 of the third region 184 may be located along the longitudinal axis of the device plug 170 at a point that is halfway between the first edge portion of the third region 184 and a second edge portion of the third region 184 that is proximate to the second region 182.

The fourth contact 162 of the fourth pin 160 may be configured to contact, or electrically connect to, the fourth region 186 of the device plug 170 at a fourth location when the device plug 170 is fully inserted into the receptacle 120. In a particular embodiment, the fourth location is located along the longitudinal axis of the device plug 170 at a point between a midpoint of the fourth region 186 and a first edge portion of the fourth region 186 that is proximate to the third region 184. The midpoint of the fourth region may be located along the longitudinal axis of the device plug 170 at a point that is approximately halfway between the end 188 and the first edge portion of the fourth region 186. In alternate embodiments, the first location, the second location, the third location, and the fourth location may be located at different portions of the device plug 170, as further described with reference to FIGS. 2A-5B.

In a particular embodiment, the detection logic 110 may detect that the switch 122 is in the second state (e.g., the open state) by measuring the impedance of switch 122 via the fifth node 116, as described with reference to FIG. 1C. When the measured impedance of the switch 122 corresponds to the second impedance value the detection logic 110 may continue to detect the capability of the electronic peripheral device (e.g., the headset) that is coupled to the device plug 170, as described with reference to FIG. 1C.

For example, the detection logic 110 may continue to detect the capability of the pair of headphones by applying the bias voltage to the fourth contact 162 via the fourth pin 160 and may monitor the measured voltage level of the fourth pin 160. While the measured voltage level corresponds to the second measured voltage level, the detection logic 110 may continue to disable the internal microphone and to enable the device 100 to receive, via the fourth contact 162, input (e.g., audio signals) captured by the microphone of the headset.

In a particular embodiment, when the monitored voltage level reverts from the second voltage level to back to the first voltage level, the detection logic 110 may determine that the device plug 170 has been at least partially removed from the receptacle 120. In response, the detection logic 110 may re-enable the internal microphone and disable the ability of the device 100 to receive, via the fourth contact 162, the input (e.g., audio signals) captured by the microphone of the headset. In a particular embodiment, the detection logic 110 may disable the ability of the device 100 to receive the input via the fourth contact 162 by not applying the bias voltage to the fourth contact 162.

In another particular embodiment, the detection logic 110 may apply the bias voltage to the fourth contact 162 until the detection logic 110 detects that the switch 122 has transitioned from the second state (e.g., the open state) to the first state (e.g., the closed state). In an illustrative embodiment, the switch 122 transitions from the second state to the first state when the device plug 170 is no longer inserted into the receptacle 120 to at least the initial detection position described with reference to FIG. 1C. For example, the device plug 170 may be withdrawn from the receptacle 120 such that the device plug 170 is positioned at the pre-initial detection position described with reference to FIG. 1B. As the device plug 170 is withdrawn from the receptacle 120 the displacement of the first pin 130 may be reduced such that the first pin 130 comes into electrical contact with the switch 122. The detection logic 110 may detect, based on the measured impedance of the fifth node 116, that the switch 122 has transitioned from the second state (e.g., the open state) to the first state (e.g., the closed state).

In an illustrative embodiment, the pins 130, 140, 150, 160 and the contacts 132, 142, 152, 162 of the receptacle 120 are configured such that each of the pins 130, 140, 150, 160 and the contacts 132, 142, 152, 162 remain in electrical contact with a single one of the regions 180, 182, 184, 186 of the device plug 170 from a time that the device plug 170 is inserted into the receptacle 120 to the initial detection position (e.g., as shown in FIG. 1C) until a subsequent time when the device plug 170 is fully inserted into the receptacle 120 (e.g., as shown in FIG. 1D). For example, as shown in both FIG. 1C and FIG. 1D, the first contact 132 of the first pin 130 is contacting, or is electrically connecting to, the tip region 180 of the device plug 170, the second contact 142 of the second pin 140 is contacting, or is electrically connecting to, the second region 182 of the device plug 170, the third contact 152 of the third pin 150 is contacting, or is electrically connecting to, the third region 184 of the device plug 170, and the fourth contact 162 of the fourth pin 160 is contacting, or is electrically connecting to, the fourth region 186 of the device plug 170.

By configuring the pins 130, 140, 150, 160 and the contacts 132, 142, 152, 162 of the receptacle 120 such that the contacts 132, 142, 152, 162 remain in electrical contact with a single one of the regions 180, 182, 184, 186 of the device plug 170 from the time that the device plug 170 is inserted to the initial detection position (e.g., as shown in FIG. 1C) until the device plug 170 is fully inserted (e.g., as shown in FIG. 1D), the likelihood that the detection logic 110 will inaccurately detect the capability of an electronic peripheral device that is coupled to the device plug 170 may be reduced. Additionally, an electronic device (e.g., the electronic device 100) may benefit from the pin and contact configuration illustrated in FIGS. 1A-1D because the capabilities of the electronic peripheral device that is coupled to the device plug 170 may be usable by the electronic device (e.g., the electronic device 100) while the device plug 170 is inserted into the receptacle 120 to at least the initial detection position of FIG. 1C.

Figure 2A:
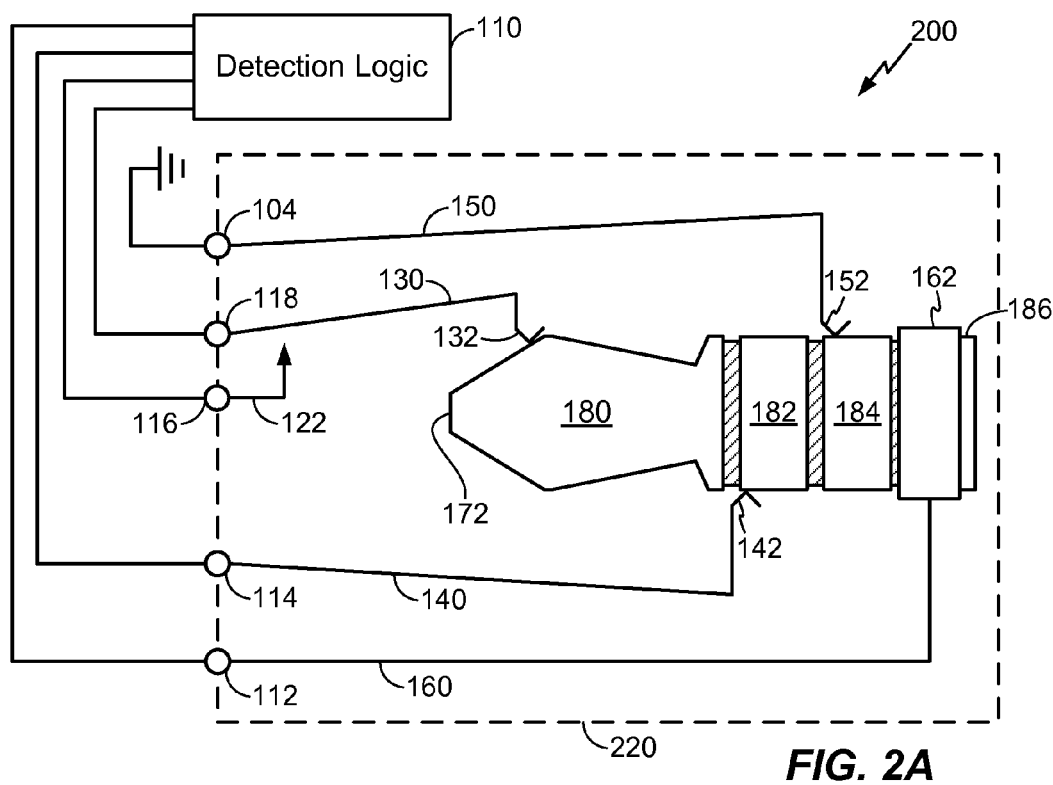
FIGS. 2A and 2B illustrate a side view of another particular illustrative embodiment of a receptacle to receive a device plug.
Figure 2B:
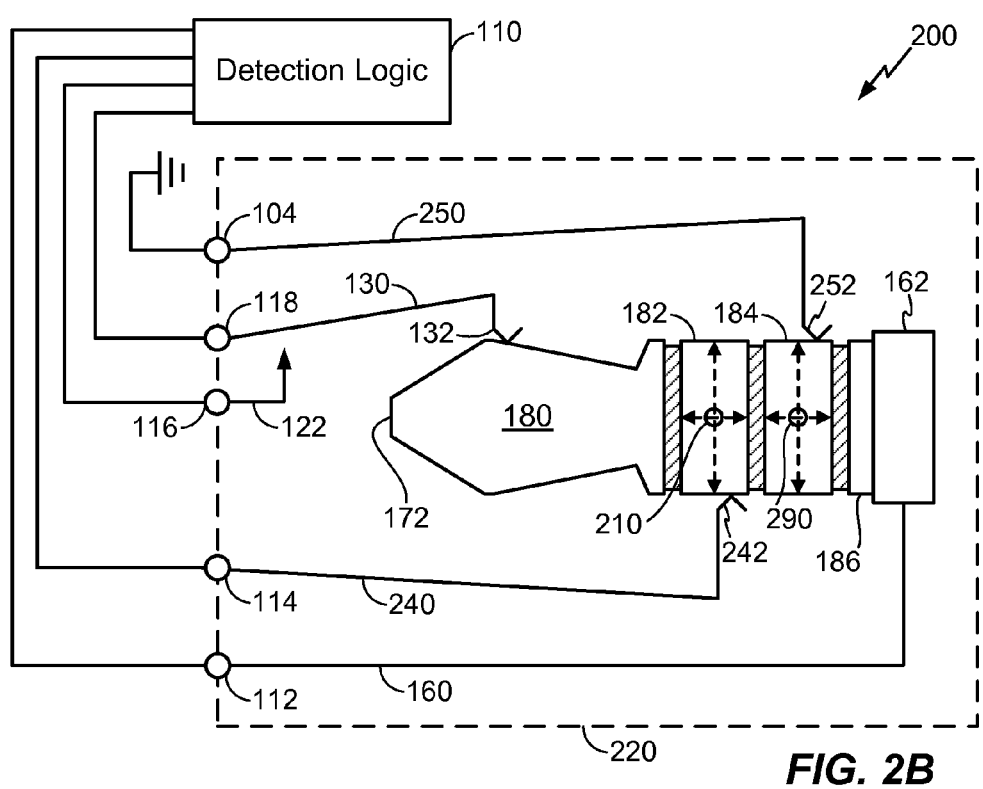

Referring to FIGS. 2A and 2B, a side view of a particular illustrative embodiment of a device 200 that includes a receptacle 220 to receive a device plug is shown. It is noted that, as compared to the receptacle 120 described with reference to FIGS. 1A-1D, the receptacle 220 includes a second pin 240 having a second contact 242 and a third pin 250 having a third contact 252. The second contact 242 and the third contact 252 of the receptacle 220 may each be configured to contact, or connect to, the device plug 170 at a different location than the second contact 142 and the third contact 152, respectively, when the device plug 170 is inserted into the receptacle 220 to the initial detection position or is fully inserted into receptacle 220. As shown in FIGS. 2A and 2B, the device 200 may include the detection logic 110 and the receptacle 220 may be configured to receive the device plug 170 as described with reference to FIGS. 1A-1D.

Referring FIG. 2A, the device plug 170 has been inserted into the receptacle 220 to the initial detection position described with reference to FIG. 1C. As shown in FIG. 2A, when the device plug 170 is at the initial detection position, the first contact 132 may contact, or connect to, the tip region 180, the second contact 242 may contact, or connect to, the second region 182, the third contact 252 may contact, or connect to, the third region 184, and the fourth contact 162 may contact, or connect to, the fourth region 186.

Referring to FIG. 2B, the device plug 170 has been fully inserted into the receptacle 220. As shown in FIG. 2B, the second contact 242 may be configured to contact, or connect to, the second region 182 of the device plug 170 at a different location than the second contact 142 shown in FIG. 1D. For example, when the device plug 170 is fully inserted into the receptacle 220, the second contact 242 may be configured to contact, or connect to, the second region 182 of the device plug 170 at a location that is located along the longitudinal axis of the device plug 170 at a point between the midpoint 210 of the second region 182 and a first edge portion of the second region 182 that is proximate to the third region 184. The midpoint 210 of the second region 182 may be located along the longitudinal axis of the device plug 170 at a point that is located approximately halfway between the first edge portion of the second region 182 and a second edge portion of the second region 182 that is proximate to the tip region 180.

Figure 3A:
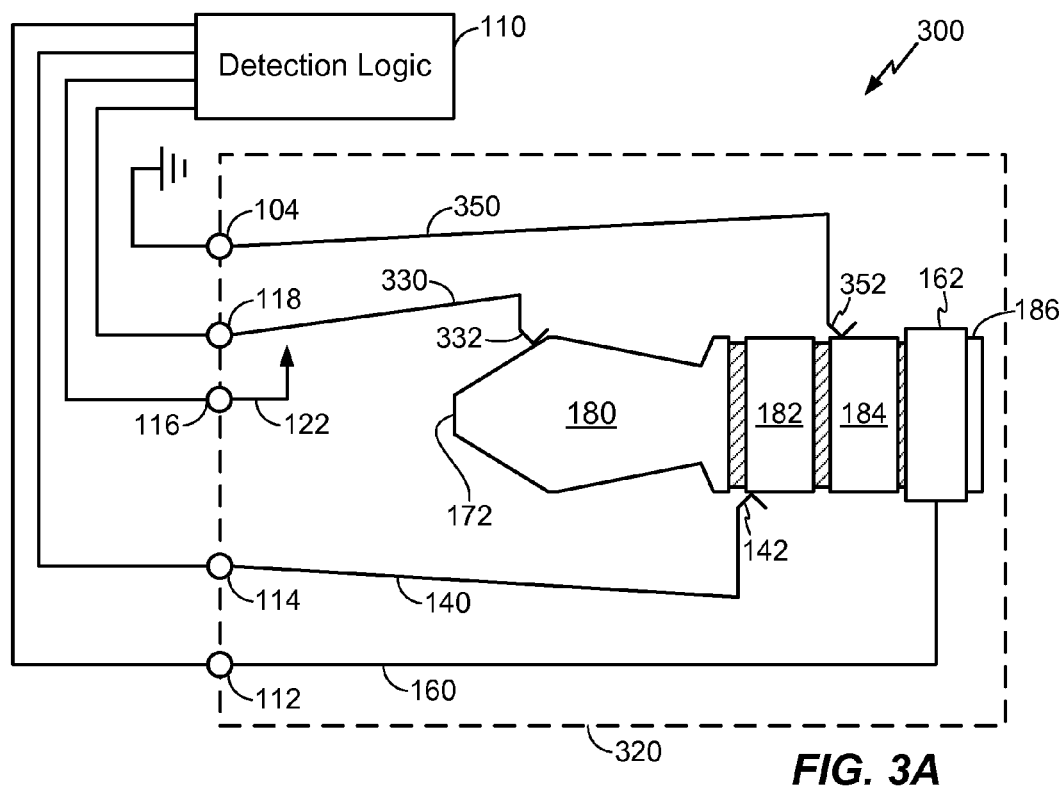
FIGS. 3A and 3B illustrate a side view of another particular illustrative embodiment of a receptacle to receive a device plug.
Figure 3B:
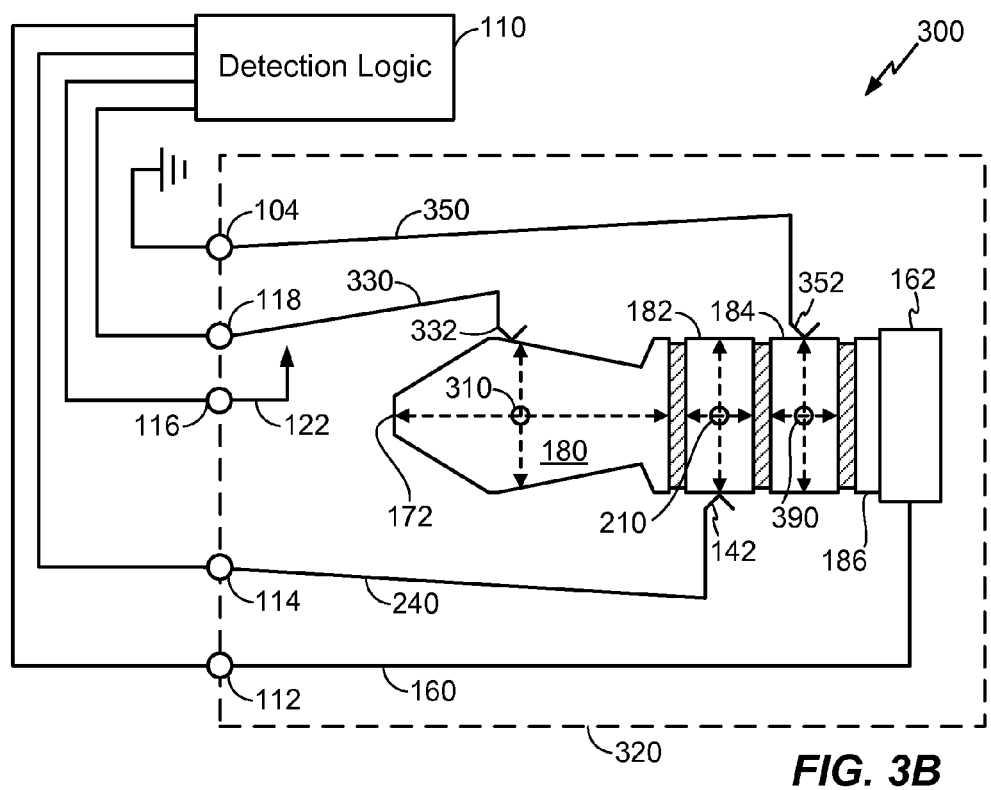

Referring to FIGS. 3A and 3B, a side view of a particular illustrative embodiment of a device 300 that includes a receptacle 320 to receive a device plug is shown. It is noted that, as compared to the receptacle 120 described with reference to FIGS. 1A-1D, the receptacle 320 includes a first pin 330 having a first contact 332 and a third pin 350 having a third contact 352. The first contact 332 and the third contact 352 of the receptacle 320 may each be configured to contact, or connect to the device plug 170 at a different location than the first contact 132 and the third contact 152, respectively, when the device plug 170 is inserted into the receptacle 320 to the initial detection position or is fully inserted into receptacle 320. As shown in FIGS. 3A and 3B, the device 300 may include the detection logic 110, and the receptacle 320 may be configured to receive the device plug 170 as described with reference to FIGS. 1A-1D.

Referring to FIG. 3A, the device plug 170 has been inserted into the receptacle 320 to the initial detection position described with reference to FIG. 1C. As shown in FIG. 3A, when the device plug 170 is at the initial detection position, the first contact 332 may contact, or connect to, the tip region 180, the second contact 142 may contact, or connect to, the second region 182, the third contact 352 may contact, or connect to, the third region 184, and the fourth contact 162 may contact, or connect to, the fourth region 186.

Referring to FIG. 3B, the device plug 170 has been fully inserted into the receptacle 320. As shown in FIG. 3B, the first contact 332 may be configured to contact, or connect to, the tip region 180 of the device plug 170 at a different location than the first contact 132 shown in FIG. 1D and the third contact 352 may be configured to contact, or connect to, the tip region 180 of the device plug 170 at a different location than the third contact 152 shown in FIG. 1D. For example, when the device plug 170 is fully inserted into the receptacle 320, the first contact 332 contacts, or connects to, the tip region 180 at a location that is located along the longitudinal axis of the device plug 170 at a point between the tip 172 and a midpoint 310 of the tip region 180. When the device plug 170 is fully inserted into the receptacle 320, the third contact 352 may contact, or connect to, the third region 184 location that is located along the longitudinal axis at a point 390 that is located approximately halfway between a first edge portion of the third region 184 that is proximate the second region 182 and a second edge portion of the third region 184 that is proximate to the fourth region 186.

Figure 4A:
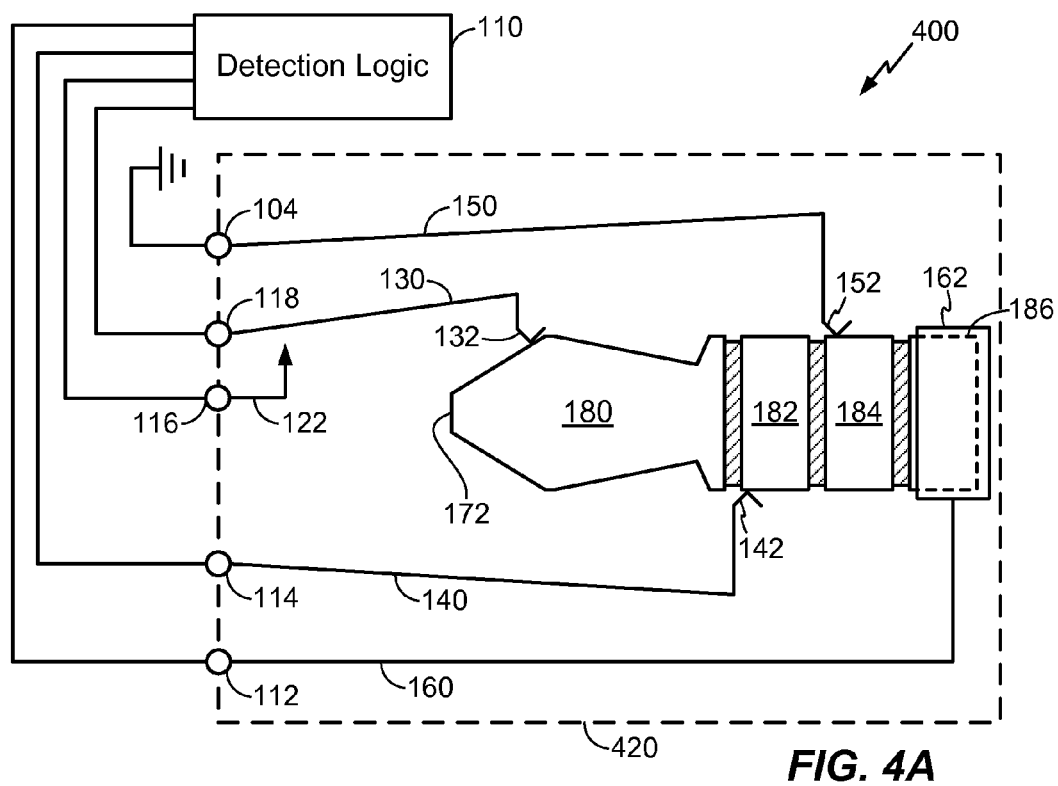
FIGS. 4A and 4B illustrate a side view of another particular illustrative embodiment of a receptacle to receive a device plug.
Figure 4B:
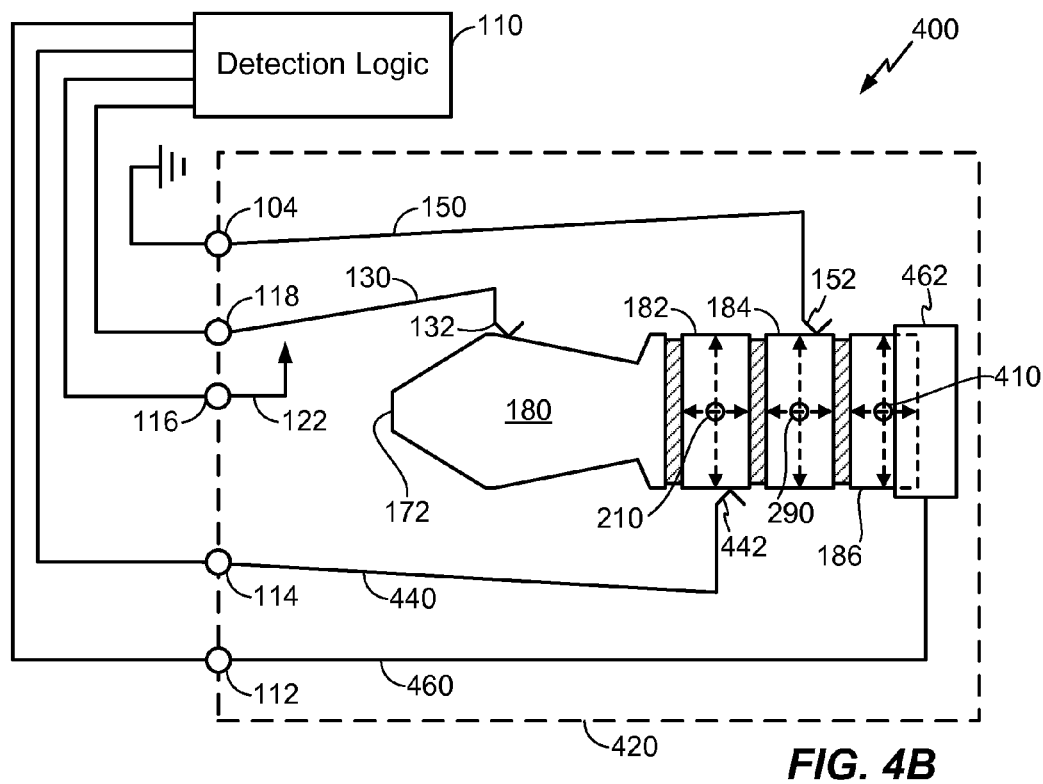

Referring to FIGS. 4A and 4B, a side view of a particular illustrative embodiment of a device 400 that includes a receptacle 420 to receive a device plug is shown. It is noted that, as compared to the receptacle 120 described with reference to FIGS. 1A-1D, the receptacle 420 includes a second pin 440 having a second contact 442 and a fourth pin 460 having a fourth contact 462. The second contact 442 and the fourth contact 462 of the receptacle 420 may each be configured to contact, or connect to, the device plug 170 at a different location than the second contact 142 and the fourth contact 162, respectively, when the device plug 170 is inserted into the receptacle 420 to the initial detection position or is fully inserted into receptacle 420. As shown in FIGS. 4A and 4B, the device 400 may include the detection logic 110, and the receptacle 420 may be configured to receive the device plug 170 as described with reference to FIGS. 1A-1D.

Referring to FIG. 4A, the device plug 170 has been inserted into the receptacle 420 to the initial detection position described with reference to FIG. 1C. As shown in FIG. 4A, when the device plug 170 is at the initial detection position, the first contact 132 may contact, or connect to, the tip region 180, the second contact 442 may contact, or connect to, the second region 182, the third contact 152 may contact, or connect to, the third region 184, and the fourth contact 462 may contact, or connect to, the fourth region 186.

Referring to FIG. 4B, the device plug 170 has been fully inserted into the receptacle 420. As shown in FIG. 4B, the second contact 442 may be configured to contact, or connect to, the second region 182 of the device plug 170 at a different location than the second contact 142 shown in FIG. 1D and the fourth contact 462 may be configured to contact, or connect to, the fourth region 186 of the device plug 170 at a different location than the fourth contact 162 shown in FIG. 1D. For example, when the device plug 170 is fully inserted into the receptacle 420, the second contact 442 may contact, or connect to, the second region 182 at a location that is located along the longitudinal axis of the device plug 170 at a point between the midpoint 210 of the second region 182 and a first edge portion of the second region 182 that is proximate to the third region 184. The midpoint 210 of the second region 182 may be located along the longitudinal axis of the device plug 170 at a point that is located approximately halfway between the first edge portion of the second region 182 and a second edge portion of the second region 182 that is proximate to the tip region 180. The fourth contact 462 may contact, or connect to, the fourth region 186 at a location that is located along the longitudinal axis of the device plug 170 at a point between a midpoint 410 of the fourth region 186 and the end 188 of the device plug 170. The midpoint 410 of the fourth region 186 may be located along the longitudinal axis of the device plug 170 at a point that is located approximately halfway between a first edge portion of the fourth region 186 that is proximate to the third region and the end 188.

It should be noted that the contact locations shown in FIGS. 1C and 1D are for illustration only. Alternate configurations of a receptacle, such as the embodiments described with reference to FIGS. 2A-4B, may also be implemented, such that the contacts of the receptacle remain in contact with, or connected to, the same region of a device plug (e.g. the device plug 170) from initial detection until full insertion. By configuring the pins and the contacts of the receptacle 120 such that they remain in electrical contact with, or electrically connected to, a single one of the regions 180, 182, 184, 186 of the device plug 170 from the time that the device plug 170 is inserted to the initial detection position to when the device plug 170 is fully inserted, the likelihood that the detection logic 110 will inaccurately detect the capability of an electronic peripheral device that is coupled to the device plug 170 may be reduced. For example, such inaccurate detection may otherwise occur when a user has not fully inserted the device plug 170 into the receptacle (e.g., the receptacle 120) and/or when one of the contacts (e.g., the contacts 132, 142, 152, 162) contacts, or connects to, an insulating layer of the device plug 170 (e.g., the insulating layers 190, 192, 194).

Figure 5A:
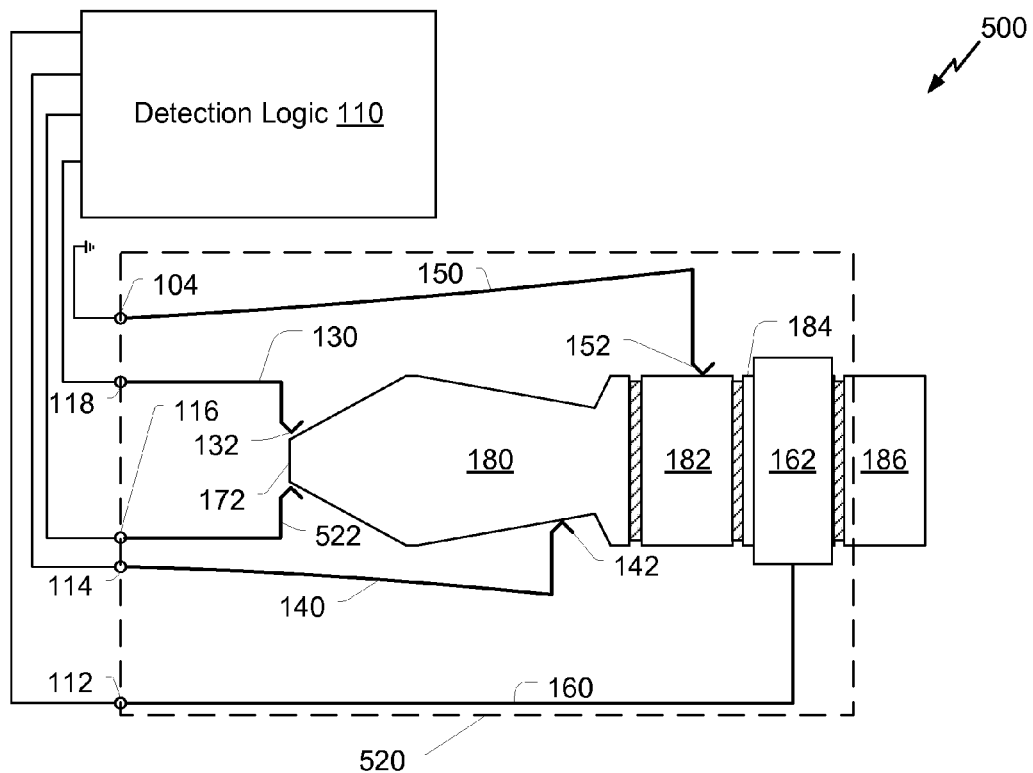
FIGS. 5A and 5B illustrate a side view of another particular illustrative embodiment of a receptacle to receive a device plug.
Figure 5B:
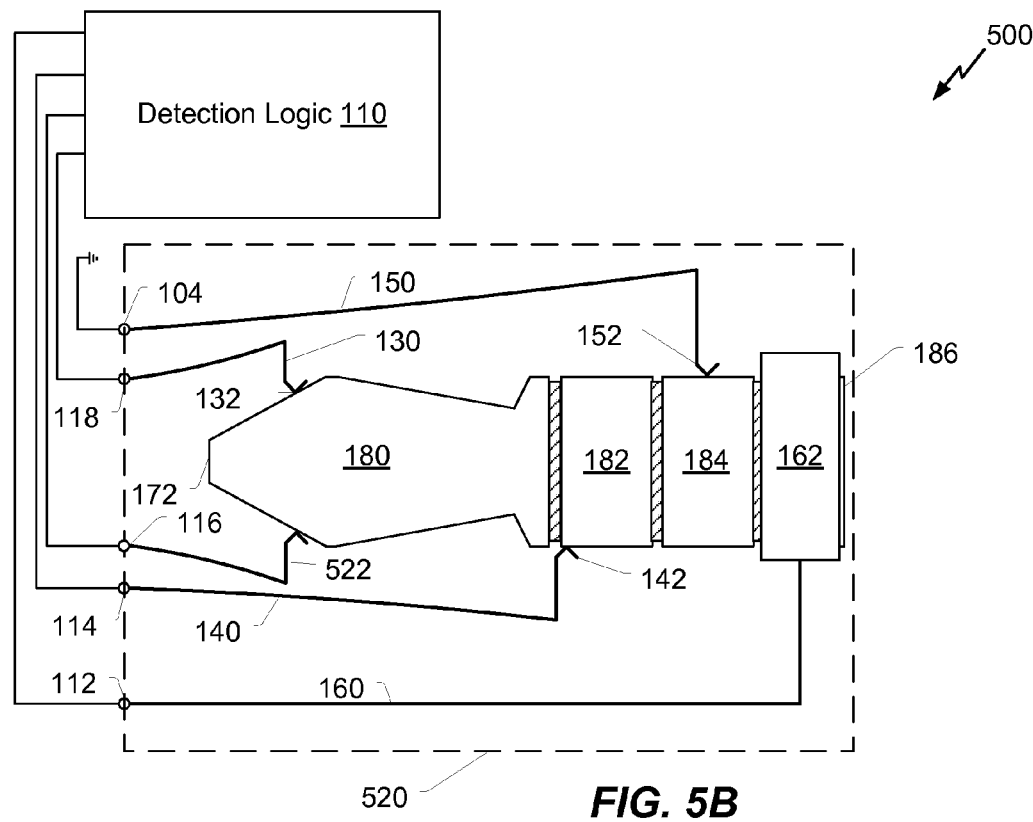

Referring to FIGS. 5A and 5B, a side view of a particular illustrative embodiment of a receptacle 520 to receive a device plug is shown. As shown in FIGS. 5A and 5B, the device 500 includes a receptacle 520, the detection logic 110, and the device plug 170 described with reference to FIGS. 1A-4B are shown. In contrast to FIGS. 1A-4B, the receptacle 520 shown in FIGS. 5A and 5B may include a normally-open (NO) switch 522 instead of the normally closed switch 122. As shown in FIG. 5A, the switch 522 may be configured to be in the second state (e.g., the open state) prior to the device plug being inserted to the initial detection position. To illustrate, the second state may correspond to a state in which the switch 522 is not in contact with, or is not connected to, the tip region 180 of the device plug 170.

As shown in FIG. 5B, the switch 522 may transition from the second state to the first state (e.g., the closed state) when the device plug 170 has been inserted into the receptacle 520 to at least an initial detection position. When the device plug 170 is inserted into the receptacle 520 to the initial detection position the first contact 132 of first pin 130 may be in contact with, or connected to, the tip region 180, causing the first pin 130 to be displaced from its initial position (i.e., the position of the first pin 130 in FIG. 5A). Further, FIG. 5B illustrates that when the device plug 170 is inserted to the initial detection position, the second contact 142 of the second pin 140 may be in electrical contact with, or electrically connected to, the second region 182 of the device plug 170, the third contact 852 of the third pin 150 may be in electrical contact, or electrically connected to, the third region 184 of the device plug 170, and the fourth contact 162 of the fourth pin 160 may be in electrical contact, or electrically connected to, the fourth region 186 of the device plug 170 without contacting the third region 184 of the device plug 170.

As shown in FIG. 5B, when the device plug 170 is inserted into the receptacle 520 to the initial detection position the switch 522 may come into electrical contact with, or be electrically connected to, the tip region 180 of the device plug 170. When the switch 522 comes into electrical contact with the tip region 180, the switch 522 may transition from the second state (e.g., the open state) to the first state (e.g., the closed state). During operation, the detection logic 110 may detect a state of the switch 522 and initiate additional operations (e.g., enable/disable a microphone internal to the device). In alternate embodiments, the pin and contact location configurations illustrated in FIGS. 1A-4B may be used with the switch 522 described with reference to FIGS. 5A and 5B instead of the normally-closed switch 122.

Figure 6:
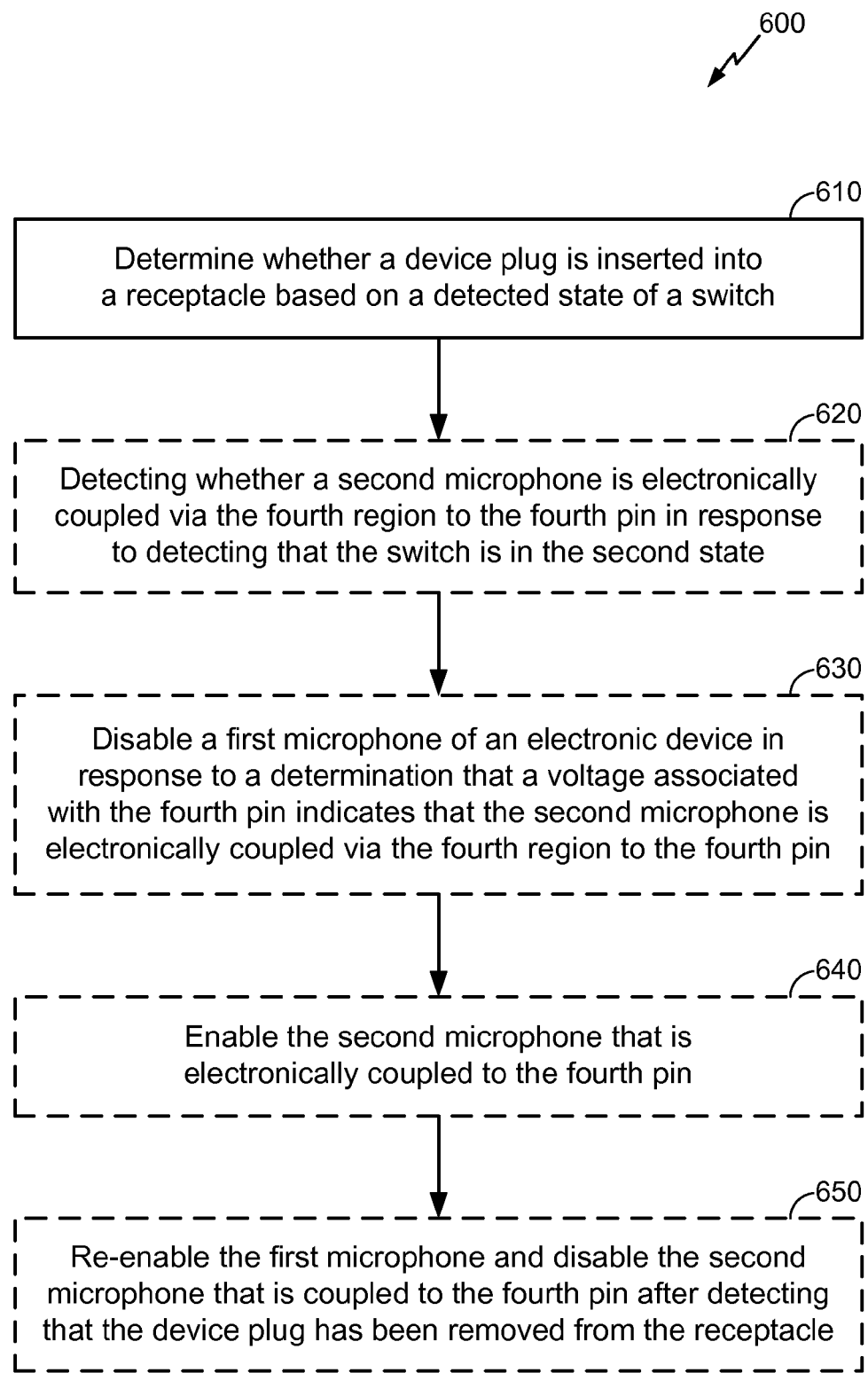
FIG. 6 is a flow chart of a particular illustrative embodiment of a method of detecting insertion of a device plug into a receptacle.

Referring to FIG. 6, a flow chart of a particular illustrative embodiment of a method of detecting insertion of a device plug into a receptacle is shown and generally designated 600. The method 600 may be performed using any combination of the detection logic and the receptacles described with reference to FIGS. 1A-5B.

The method 600 may include determining whether a device plug is inserted into a receptacle based on a detected state of a switch, at 610. The receptacle may include a switch configured to transition from a first state to a second state. In this embodiment, the switch may be the switch 122 described with reference to FIGS. 1A-4B and the detection logic 110 may detect a state of the switch 122 as described with reference to FIGS. 1A-1D. In another particular embodiment, the switch may be the switch 522 described with reference to FIGS. 5A and 5B. In an embodiment, the first state corresponds to a closed state and the second state corresponds to an open state. In an alternate embodiment, the first state corresponds to an open state and the second state corresponds to a closed state.

The receptacle may include a plurality of pins, where each of the plurality of pins may be configured to contact a specific region of the device plug at a particular location when the device plug is fully inserted into the receptacle. In a particular embodiment, the receptacle may be the receptacle 120 described with reference to FIGS. 1A-1D, the receptacle 220 described with reference to FIGS. 2A and 2B, the receptacle 320 described with reference to FIGS. 3A and 3B, the receptacle 420 described with reference to FIGS. 4A and 4B, or the receptacle 520 described with reference to FIGS. 5A and 5B.

The receptacle may be incorporated into an electronic device that includes a first (e.g., internal) microphone. The device plug may be coupled to a second microphone that is external to the electronic device. The method 600 may further include detecting whether a second microphone is electronically coupled via the fourth region to the fourth pin in response to detecting that the switch is in the second state, at 620. For example, when the switch (e.g., the switch 122) transitions from the first state to the second state, detection logic (e.g., the detection logic 110) may detect whether the second microphone is electronically coupled via the fourth region to the fourth pin. Detecting whether the second microphone is electronically coupled via the fourth region to the fourth pin may be performed by applying a bias signal to the fourth region of the device plug via the fourth pin and measuring a voltage associated with the fourth pin. The voltage associated with the fourth pin may be measured relative to a ground. The measure voltage may indicate that the second microphone is electronically coupled to the fourth pin via the fourth region.

The method 600 may further include disabling the first microphone of the electronic device in response to a determination that the voltage associated with the fourth pin indicates that the second microphone is electronically coupled via the fourth region to the fourth pin, at 630. The method 600 may further include enabling the second microphone that is electronically coupled to the fourth pin, at 640, and enabling the electronic device to receive an input from the second microphone. The method 600 may further include re-enabling the first microphone and disabling the second microphone that is coupled to the fourth pin after detecting that the device plug has been removed from the receptacle, at 650. Enabling the second microphone when the fourth region of the device plug is electronically coupled via the fourth region to the fourth pin at initial detection may reduce power consumption by not providing power to the internal microphone of an electronic device. Power consuming circuitry associated with the internal microphone may also be disabled and re-enabled based on the state of the switch.

Figure 7:
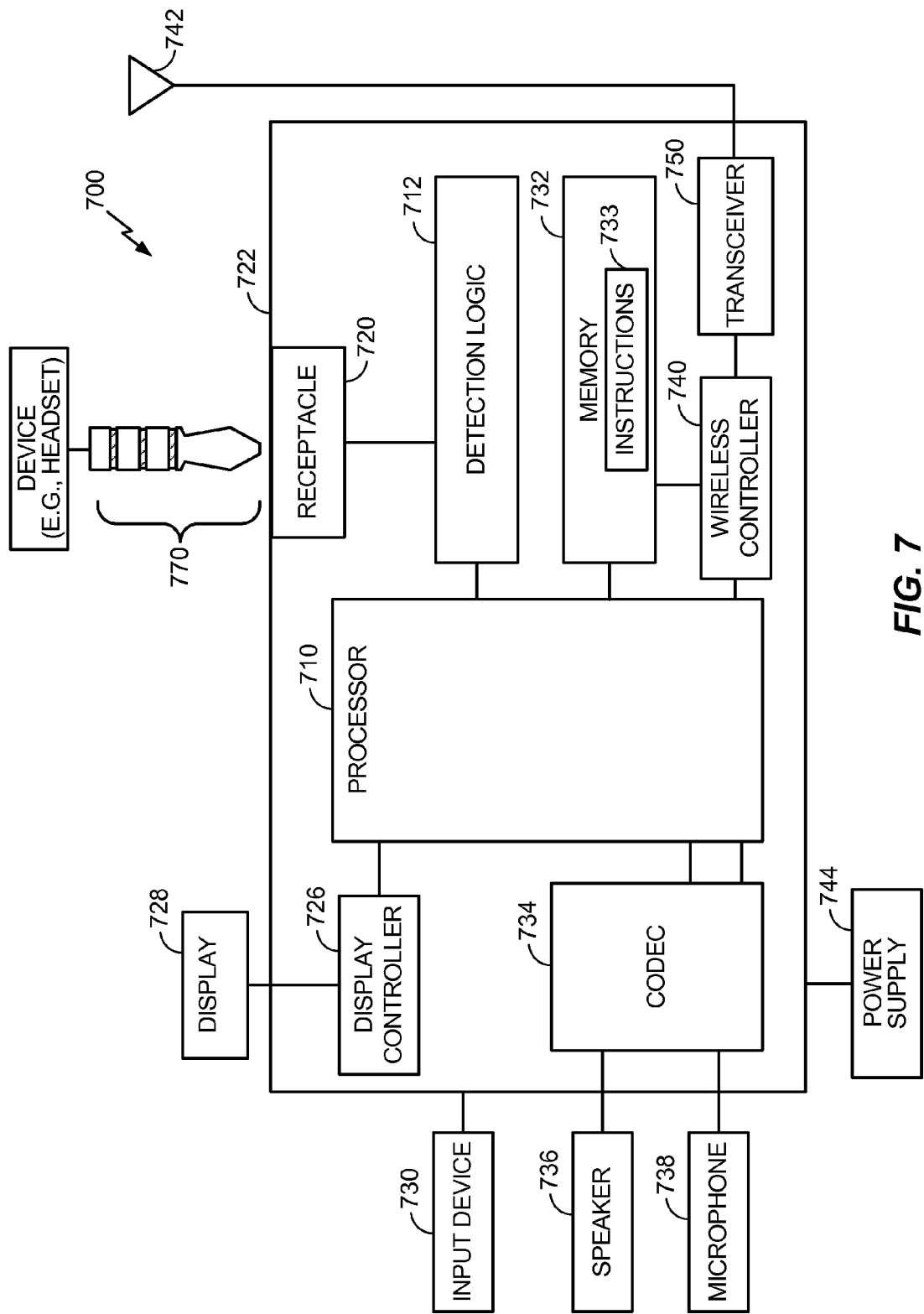
FIG. 7 is a block diagram of a wireless device including a receptacle to receive a device plug.

Referring to FIG. 7, a block diagram of a particular illustrative embodiment of an electronic device is shown and generally designated 700. The electronic device 700 may include a processor 710, such as a digital signal processor (DSP), coupled to a memory 732. The electronic device 700 may include a receptacle 720 to receive a device plug 770, and detection logic 712 to detect insertion of the device plug 170 into the receptacle 720. The detection logic 712 may be the detection logic 110 as described with reference FIGS. 1-5B and the device plug 770 may be the device plug 170 as described with reference FIGS. 1-5B. The receptacle 720 may be the receptacle 120 described with reference to FIGS. 1A-1D, the receptacle 220 described with reference to FIGS. 2A and 2B, the receptacle 320 described with reference to FIGS. 3A and 3B, the receptacle 420 described with reference to FIGS. 4A and 4B, or the receptacle 520 described with reference to FIGS. 5A and 5B.

The detection logic 712 may detect insertion of the device plug 770 into the receptacle 720 to a fully inserted position. When the device plug 770 is inserted to the fully inserted position, a first pin of the receptacle 720 may be configured to contact a tip region of the device plug at a first location, a second pin of the receptacle 720 may be configured to contact a second region of the device plug 770 at a second location, a third pin of the receptacle 720 may be configured to contact a third region of the device plug 770 at a third location, and a fourth pin of the receptacle 720 may be configured to contact a fourth region of the device plug 770 at a fourth location.

In various embodiments, one or more of the first location, the second location, the third location, and the fourth location may be located along the device plug 770 as described with reference to one or more of the embodiments of FIGS. 1A-1D, FIGS. 2A and 2B, FIGS. 3A and 3B, FIGS. 4A and 4B, and FIGS. 5A and 5B. The pins and the contacts of the receptacle 720 may be configured to contact a region of the device plug 770 corresponding each of the first location, the second location, the third location, and the fourth location such that the contacts of the pins remain in contact with the same region of the device plug 770 from initial detection until full insertion of the device plug 770 into the receptacle 720. The detection logic 712 may detect insertion of the device plug 770 based on a switch of the receptacle 720 transitioning from a first state to a second state.

In an alternative embodiment, the detection logic 712 may be implemented on-chip, such as via the processor 710. The memory 732 may be a non-transitory computer readable medium storing instructions 733 that when executed by the processor 710, cause the processor 710 to determine whether a device plug 770 is inserted into a receptacle 720 based on a switching signal. The instructions 733 may also include instructions that, when executed by the processor 710, cause the processor 710 to determine whether an external microphone is electronically coupled via a fourth region of the device plug 770 to a fourth pin of the receptacle 720 when the switching signal indicates that a switch is in a second state. The instructions 733 may also include instructions that, when executed by the processor 710, cause the processor 710 to apply a bias signal to the fourth region of the device plug 770 via the fourth pin of the receptacle 720. The instructions 733 may also include instructions that, when executed by the processor 710, may cause the processor 710 to determine whether a voltage associated with the fourth pin indicates that the microphone is electronically coupled via the fourth region to the fourth pin.

The instructions 733 may also include instructions that, when executed by the processor 710, may cause the processor 710 to disable a microphone 738 in response to a determination that the voltage associated with the fourth pin indicates that the external microphone is electronically coupled via the fourth region to the fourth pin. The instructions 733 may also include instructions that, when executed by the processor 710, cause the processor 710 to enable the external microphone that is electronically coupled to the fourth pin. The instructions 733 may also include instructions that, when executed by the processor 710, cause the processor 710 to re-enable the microphone 738 and to disable the external microphone that is coupled to the fourth pin after detecting that the device plug 770 has been removed from the receptacle 720.

As shown in FIG. 7, the electronic device 700 includes a display controller 726 that is coupled to the processor 710 and to a display 728. A coder/decoder (CODEC) 734 may also be coupled to the processor 710. A speaker 736 and the microphone 738 can be coupled to the CODEC 734. In a particular embodiment, the microphone 738 may be internal to electronic device 700.

As shown in FIG. 7, the electronic device 700 includes a wireless controller 740 that may be coupled to a transceiver 750 that is coupled to an antenna 742. In a particular embodiment, the processor 710, the display controller 726, the memory 732, the CODEC 734, the transceiver 750, and the wireless controller 740 are included in a system-in-package or a system-on-chip device 722. In a particular embodiment, an input device 730 and a power supply 744 are coupled to the system-on-chip device 722. In a particular embodiment, the display 728, the input device 730, the speaker 736, the microphone 738, the wireless antenna 742, the receptacle 720, detection logic 712, and the power supply 744 may be external to the system-on-chip device 722. However, each of the display 728, the input device 730, the speaker 736, the microphone 738, the wireless antenna 742, and the power supply 744 may be coupled to a component of the system-on-chip device 722, such as an interface or a controller.

In conjunction with the described embodiments, a system is disclosed that may include means for determining whether a device plug is inserted into a receptacle based on a switching signal. The means for determining whether the device plug is inserted may include the detection logic 110 of FIGS. 1A-5B, the detection logic 712 of FIG. 7, the instructions 733, one or more other devices or circuits configured to determine whether a device plug is inserted into a receptacle, or any combination thereof. The system may also include means for determining whether an external microphone is electronically coupled via a fourth region of the device plug to a fourth pin of the receptacle when the switching signal indicates that a switch is in a second state. The means for determining whether a microphone is electronically coupled may include the detection logic 110 of FIGS. 1A-5B, the detection logic 712 of FIG. 7, the instructions 733, one or more other devices or circuits configured to determine whether an external microphone is electronically coupled, or any combination thereof.

The system may also include means for applying a bias signal to the fourth region of the device plug via the fourth pin of the receptacle. The means for applying may include may include the detection logic 110 of FIGS. 1A-5B, the detection logic 712 of FIG. 7, the instructions 733, one or more other devices or circuits configured to apply a bias signal, or any combination thereof. The system may also include means for determining whether a voltage associated with the fourth pin indicates that the microphone is electronically coupled via the fourth region to the fourth pin. The means for determining whether a voltage associated with the fourth pin indicates that the microphone is electronically coupled may include may include the detection logic 110 of FIGS. 1A-5B, the detection logic 712 of FIG. 7, the instructions 733, one or more other devices or circuits configured to determine whether a voltage indicates that a microphone is electrically coupled, or any combination thereof.

The system may also include means for disabling a microphone in response to a determination that the voltage associated with the fourth pin indicates that the external microphone is electronically coupled via the fourth region to the fourth pin. The system may also include means for enabling the external microphone that is electronically coupled to the fourth pin. The system may also include means for re-enabling the microphone and disabling the external microphone that is coupled to the fourth pin after detecting that the device plug has been removed from the receptacle. The means for enabling, disabling, and re-enabling may include the detection logic 110 of FIGS. 1A-5B, the detection logic 1012 of FIG. 7, or the instructions 733, one or more other devices or circuits configured to enable, disable and re-enable the microphone, or any combination thereof.

Those of skill would further appreciate that the various illustrative logical blocks, configurations, modules, circuits, and algorithm steps described in connection with the embodiments disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transitory storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal (e.g., a mobile phone or a PDA). In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments disclosed herein but is to be accorded the widest scope possible consistent with the principles and novel features as defined by the following claims.

The invention claimed is:

1. An apparatus comprising:
   a receptacle comprising:
      a first pin configured to contact a tip region of a device plug at a first location when the device plug is fully inserted into the receptacle, wherein the first location is located between a midpoint of the tip region and a tip of the device plug;
      a second pin configured to contact a second region of the device plug at a second location;
      a third pin configured to contact a third region of the device plug at a third location between a midpoint of the third region and an edge portion of the third region adjacent to a fourth region of the device plug; and
      a fourth pin configured to contact the fourth region of the device plug; and
      wherein the first pin and the third pin are configured to remain in contact with the tip region and the third region respectively from an initial detection position until the device is fully inserted.

2. The apparatus of claim 1, wherein the second region of the device plug is between the tip region and the third region of the device plug.

3. The apparatus of claim 2, wherein the third region is located between the second region and the fourth region of the device plug.

4. The apparatus of claim 3, wherein the first pin, the second pin, the third pin, and the fourth pin are linearly aligned when the device plug is fully inserted.

5. The apparatus of claim 3, wherein the second region and the third region of the device plug are separated by an insulating layer.

6. The apparatus of claim 5, wherein the tip region and the second region of the device plug are separated by a second insulating layer.

7. The apparatus of claim 6, wherein the third region and the fourth region of the device plug are separated by a third insulating layer.

8. The apparatus of claim 1, wherein the initial detection position is a position where the fourth pin contacts the fourth region without contacting the third region.

9. The apparatus of claim 1, wherein the second location is located between a midpoint of the second region and an edge portion of the second region that is proximate to the third region, wherein the midpoint of the second region is located at a point that is approximately halfway between the edge portion of the second region that is proximate to the third region and a second edge portion of the second region that is proximate to the tip region.

10. The apparatus of claim 1, wherein the second location is located between a midpoint of the second region and an edge portion of the second region that is proximate to the tip region, wherein the midpoint of the second region is located at a point that is approximately halfway between the edge portion of the second region that is proximate to the tip region and a second edge portion of the second region that is proximate to the third region.

11. The apparatus of claim 1, further comprising a switch, wherein the switch is biased in a first state when the device plug is not in initial detection state and not fully inserted into the receptacle and wherein the switch is biased to a second state when the device plug is in initial detection state or fully inserted into the receptacle.

12. The apparatus of claim 11, wherein the first state corresponds to a closed state and wherein the second state corresponds to an open state.

13. The apparatus of claim 11, wherein the first state corresponds to an open state and wherein the second state corresponds to a closed state.

14. The apparatus of claim 11, wherein the switch is biased to the first state when the device plug is at partially removed from the receptacle.

15. The apparatus of claim 11, further comprising detection logic electronically coupled to the first pin, the second pin, the third pin, the fourth pin, and the switch, wherein the detection logic is configured to:
   detect, based on a state of the switch, whether the device plug is inserted into the receptacle; and
   when the switch is in the second state initiate capability detection
      apply a bias signal to the fourth region of the device plug via the fourth pin; and
      determine whether a voltage of the fourth pin relative to a ground indicates that a microphone is coupled to the fourth region of the device plug.

16. The apparatus of claim 1, wherein the first pin is electrically coupled via the tip region to a first audio channel of an electronic device when the device plug is fully inserted into the receptacle, wherein the second pin is electrically coupled to a second audio channel of the electronic device when the device plug is fully inserted into the receptacle, wherein the third region is electrically coupled to a ground terminal via the third pin when the device plug is fully inserted into the receptacle, and wherein the fourth pin is electrically coupled via the fourth region to a microphone of the electronic device when the device plug is fully inserted into the receptacle.

17. A method comprising:
   determining, at detection logic, whether a device plug is inserted into a receptacle based on a switching signal, wherein the receptacle comprises:
      a switch configured to generate the switching signal when the switch transitions from a first state to a second state, wherein the first state indicates the device plug is not inserted into the receptacle, and wherein the second state indicates the device plug is inserted into the receptacle;
      a first pin configured to contact a tip region of the device plug at a first location when the device plug is inserted into the receptacle, wherein the first location is located between a midpoint of the tip region and a tip of the device plug;
      a second pin configured to contact a second region of the device plug at a second location when the device plug is inserted into the receptacle;
      a third pin configured to contact the third region of the device plug at a third location when the device plug is inserted into the receptacle, wherein the third location is located between a midpoint of the third region and an edge portion of the third region adjacent to a fourth region of the device plug; and
      a fourth pin configured to contact the fourth region of the device plug at a fourth location when the device plug is inserted into the receptacle;
      wherein the first pin and the third pin are configured to remain in contact with the tip region and the third region respectively from an initial detection position until the device is fully inserted; and when the switching signal indicates that the switch is in the second state determining whether a microphone is electronically coupled via the fourth region to the fourth pin.

18. The method of claim 17, wherein the second location is located between a midpoint of the second region and an edge portion of the second region adjacent to a third region of the device plug.

19. The method of claim 17, wherein the fourth location is located between a midpoint of the fourth region and an edge portion of the fourth region, wherein the midpoint of the fourth region is located at a point that is located approximately halfway between a first edge portion of the fourth region that is proximate to the third region and an end of the device plug.

20. The method of claim 17, wherein determining whether the microphone is electronically coupled via the fourth region to the fourth pin further comprises:
applying a bias signal to the fourth region of the device plug via the fourth pin; and
determining whether a voltage associated with the fourth pin relative to a ground indicates that the microphone is electronically coupled via the fourth region to the fourth pin.

21. The method of claim 20, wherein the receptacle is incorporated into an electronic device, wherein the microphone is external to the electronic device, and further comprising disabling a second microphone in response to a determination that the voltage associated with the fourth pin indicates that the microphone is electronically coupled via the fourth region to the fourth pin, wherein the second microphone is incorporated into the electronic device.

22. The method of claim 21, further comprising enabling the microphone that is electronically coupled to the fourth pin.

23. The method of claim 22, further comprising re-enabling the second microphone and disabling the microphone in response to detecting that the device plug has been removed from the receptacle.

24. The method of claim 17, wherein the first state corresponds to a closed state and wherein the second state corresponds to an open state.

25. The method of claim 17, wherein the initial detection position is a position where the fourth pin contacts the fourth region without contacting the third region.

26. An apparatus comprising:
a first pin configured to contact a tip region of a device plug at a first location when the device plug is inserted into a receptacle, wherein the first location is located between a midpoint of the tip region and a tip of the device plug;
a second pin configured to contact a second region of the device plug at a second location;
a third pin configured to contact the third region of the device plug at a third location between a midpoint of the third region and an edge portion of the third region adjacent to a fourth region of the device plug;
a fourth pin configured to contact the fourth region of the device plug at a fourth location;
detection logic responsive to a switch to determine whether a microphone is electrically coupled to the fourth pin; and
wherein the first pin and third pin is configured to remain in contact with the tip region and third region respectively from an initial detection position until the device is fully inserted.

27. The apparatus of claim 26, wherein the second location is located between a midpoint of the second region and an edge portion of the second region adjacent to a third region of the device plug.

28. The apparatus of claim 26, wherein the fourth location is located between a midpoint of the fourth region and an end of the device plug, wherein the midpoint of the fourth region is located at a point that is located approximately halfway between a first edge portion of the fourth region that is proximate to the third region and the end of the device plug.

29. The apparatus of claim 26, wherein the first location is located between a midpoint of the tip region and a tip of the device plug and wherein the fourth location is located between a midpoint of the fourth region and an edge portion of the fourth region, wherein the midpoint of the tip region is located at a point that is located approximately halfway between the tip of the device plug and an edge portion of the tip region that is proximate to the second region, and wherein the midpoint of the fourth region is located at a point that is located approximately halfway between a first edge portion of the fourth region that is proximate to the third region and an end of the device plug.

30. The apparatus of claim 26, wherein the switch is in a first state when the device plug is not in initial detection state and not inserted into the receptacle and wherein the switch is in a second state when the device plug is in initial detection state or inserted into the receptacle.

31. The apparatus of claim 30, wherein the first state corresponds to a closed state and wherein the second state corresponds to an open state.

32. The apparatus of claim 30, wherein the initial detection position is a position where the fourth pin contacts the fourth region without contacting the third region.

33. A computer-readable storage medium comprising instructions that, when executed by a processor, cause the processor to:
determine whether a device plug is inserted into a receptacle based on a switching signal, wherein the receptacle comprises:
a switch configured to generate the switching signal when the switch transitions from a first state to a second state, wherein the first state indicates the device plug is not inserted into the receptacle, and wherein the second state indicates the device plug is inserted into the receptacle;
a first pin configured to contact a tip region of the device plug at a first location when the device plug is inserted into the receptacle, wherein the first location is located between a midpoint of the tip region and a tip of the device plug;
a second pin configured to contact a second region of the device plug at a second location when the device plug is inserted into the receptacle, wherein the second location is located between a midpoint of the second region and an edge portion of the second region adjacent to a third region of the device plug;
a third pin configured to contact the third region of the device plug at a third location when the device plug is inserted into the receptacle, wherein the third location is located between a midpoint of the third region and an edge portion of the third region adjacent to a fourth region of the device plug;
a fourth pin configured to contact the fourth region of the device plug at a fourth location when the device plug is inserted into the receptacle;
wherein the first pin, second pin, and third pin is configured to remain in contact with the tip region, second region, and third region respectively from an initial detection position until the device is fully inserted; and when the switching signal indicates that the switch is in the second state, determine whether a microphone is electronically coupled via the fourth region to the fourth pin.

34. An apparatus comprising:

first means for contacting a tip region of a device plug at a first location when the device plug is inserted into a receptacle, wherein the first location is located between a midpoint of the tip region and a tip of the device plug;

second means for contacting a second region of the device plug at a second location between a midpoint of the second region and an edge portion of the second region adjacent to a third region of the device plug;

third means for contacting the third region of the device plug at a third location between a midpoint of the third region and an edge portion of the third region adjacent to a fourth region of the device plug;

fourth means for contacting the fourth region of the device plug at a fourth location; and means for determining whether a microphone is electrically coupled to the fourth means.

35. The apparatus of claim 34, wherein the second means contacts the second region of the device plug when the device plug has been inserted into the receptacle to an initial detection position and wherein the third means contacts the third region of the device plug when the device plug has been inserted into the receptacle to the initial detection position.

36. The apparatus of claim 35, wherein the second means remains in contact with the second region of the device plug until the device plug has been fully inserted into the receptacle and wherein the third means remains in contact with the third region of the device plug until the device plug has been fully inserted into the receptacle.

* * * * *